(12) United States Patent
Zhang

(10) Patent No.: US 12,026,012 B2
(45) Date of Patent: *Jul. 2, 2024

(54) HEAD-MOUNTED DEVICE

(71) Applicant: GUANGDONG OPPO MOBILE TELECOMMUNICATIONS CORP., LTD., Guangdong (CN)

(72) Inventor: Minghao Zhang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 180 days.

This patent is subject to a terminal disclaimer.

(21) Appl. No.: 17/832,682

(22) Filed: Jun. 5, 2022

(65) Prior Publication Data

US 2022/0299779 A1 Sep. 22, 2022

Related U.S. Application Data

(63) Continuation of application No. PCT/CN2020/131382, filed on Nov. 25, 2020.

(30) Foreign Application Priority Data

Dec. 6, 2019 (CN) .......................... 201911244319.8

(51) Int. Cl.
- *G06F 1/16* (2006.01)
- *H05K 5/00* (2006.01)
- *H05K 5/02* (2006.01)

(52) U.S. Cl.
CPC ........... *G06F 1/163* (2013.01); *H05K 5/0086* (2013.01); *H05K 5/0217* (2013.01)

(58) Field of Classification Search
CPC ............... G06F 1/163; G02B 27/0176; G02B 2027/0154; H05K 5/0086; H05K 5/0217

See application file for complete search history.

(56) References Cited

U.S. PATENT DOCUMENTS 10,251,292 B2 * 4/2019 Araki ................... H05K 5/0086
2002/0118506 A1 8/2002 Saito et al.
(Continued)

FOREIGN PATENT DOCUMENTS

CN 204479841 U 7/2015
CN 105661735 A 6/2016
(Continued)

OTHER PUBLICATIONS

Extended European Search Report for EP20896242.3 mailed Dec. 9, 2022 (9 pages).
(Continued)

*Primary Examiner* — Sagar Shrestha
(74) *Attorney, Agent, or Firm* — Young Basile Hanlon & MacFarlane, P.C.

(57) ABSTRACT

A head-mounted device includes a first housing, two second housings, a lacing assembly and a tightness adjustment mechanism. The lacing assembly comprises a first head band and a second head band, and one end of the first head band and one end of the second head band are overlapped and connected to form an overlapping portion. A ratchet pawl mechanism of the tightness adjustment mechanism has a ratchet pawl mechanism, and the tightness adjustment mechanism is matched with the overlapping portion through the ratchet pawl mechanism to adjust a length of the overlapping portion. The present disclosure provides a tightness adjustment mechanism, which can adjust the tightness of the first head band and the second head band by adjusting the length of the overlapping portion of the ratchet pawl mechanism.

20 Claims, 16 Drawing Sheets

(56) References Cited

U.S. PATENT DOCUMENTS

| | | | |
|---|---|---|---|
| 2015/0339468 A1 | 11/2015 | Son et al. | |
| 2016/0209661 A1 | 7/2016 | Nikkhoo | |
| 2016/0357250 A1 | 12/2016 | Kim et al. | |
| 2017/0017085 A1* | 1/2017 | Araki | G02B 27/028 |
| 2017/0337737 A1* | 11/2017 | Edwards | F16M 13/04 |
| 2018/0003984 A1* | 1/2018 | Lai | A42B 7/00 |
| 2018/0295733 A1 | 10/2018 | Wen et al. | |
| 2018/0364490 A1 | 12/2018 | Lin et al. | |
| 2019/0037715 A1* | 1/2019 | Chen | H05K 5/0017 |
| 2019/0159354 A1* | 5/2019 | Zheng | A42B 1/24 |
| 2019/0196536 A1* | 6/2019 | Wang | G06F 3/011 |
| 2019/0220056 A1* | 7/2019 | Yan | G02B 27/0176 |
| 2019/0339532 A1* | 11/2019 | Chang | G06F 1/163 |
| 2020/0257333 A1* | 8/2020 | Han | G02B 27/01 |
| 2020/0310488 A1* | 10/2020 | Lin | G02B 27/0176 |
| 2020/0371363 A1* | 11/2020 | Lin | A42B 3/04 |
| 2021/0041909 A1* | 2/2021 | Ahn | G02B 27/0176 |
| 2021/0080996 A1* | 3/2021 | Hudman | A42B 3/042 |
| 2021/0149205 A1* | 5/2021 | Jen | G02B 7/002 |
| 2021/0333558 A1* | 10/2021 | Wang | G02C 3/003 |
| 2021/0381639 A1* | 12/2021 | Howard | F16M 13/04 |
| 2022/0276497 A1* | 9/2022 | Zhan | G02B 27/0176 |
| 2022/0299782 A1* | 9/2022 | Ran | G02B 27/0176 |

FOREIGN PATENT DOCUMENTS

| | | |
|---|---|---|
| CN | 205750111 U | 11/2016 |
| CN | 205809421 U | 12/2016 |
| CN | 106405861 A | 2/2017 |
| CN | 107209384 A | 9/2017 |
| CN | 206684384 U | 11/2017 |
| CN | 206757190 U | 12/2017 |
| CN | 207689758 U | 8/2018 |
| CN | 207803549 U | 9/2018 |
| CN | 207817306 U | 9/2018 |
| CN | 108627980 A | 10/2018 |
| CN | 207992564 U | 10/2018 |
| CN | 208013552 U | 10/2018 |
| CN | 109298527 A | 2/2019 |
| CN | 109480806 A | 3/2019 |
| CN | 208621841 U | 3/2019 |
| CN | 109571336 A | 4/2019 |
| CN | 208737099 U | 4/2019 |
| CN | 208969339 U | 6/2019 |
| CN | 110162186 A | 8/2019 |
| CN | 110376740 A | 10/2019 |
| CN | 110376741 A | 10/2019 |
| CN | 209560205 U | 10/2019 |
| CN | 110441910 A | 11/2019 |
| CN | 110824715 A | 2/2020 |
| CN | 110873964 A | 3/2020 |
| CN | 110908120 A | 3/2020 |
| CN | 110967840 A | 4/2020 |
| EP | 0798083 A1 | 10/1997 |
| WO | 2018023939 A1 | 2/2018 |
| WO | 2019063706 A1 | 4/2019 |
| WO | 2019182232 A1 | 9/2019 |

OTHER PUBLICATIONS

International Search Report with English Translation for PCT Application PCT/CN2020/131382 mailed Mar. 1, 2021. (16 pages).
Chinese Frist Office Action with English Translation for CN Application 201911244319.8 mailed Feb. 2, 2021. (14 pages).
Chinese Notification to Grant Patent Rights For Invention with English Translation for CN Application 201911244319.8 mailed Aug. 6, 2021. (6 pages).
US Notice of Allowance, U.S. Appl. No. 17/833,585, mailed Apr. 12, 2024(8 pages).
International Search Report , International Application No. PCTCN2020129870, mailed Jan. 27, 2021 (17 pages).
Chinese First Office Action, Chinese Application No. 201911244286.7, mailed Mar. 3, 2021 (21 pages).
European Search Report, European Application No. 20896428.8, mailed Dec. 21, 2022 (11 pages).
Chinese First Office Action, Chinese Patent Application No. 202111683502.5, mailed Aug. 17, 2023 (16 pages).
Chinese Second Office Action, Chinese Application No. 202111683502.5, mailed Feb. 24, 2024 (15 pages).
Chinese Notification to Grant Patent Right for Invention, Chinese Application No. 201911244286.7, mailed Oct. 18, 2021 (6 pages).

* cited by examiner

HEAD-MOUNTED DEVICE

CROSS-REFERENCE TO RELATED APPLICATION(S)

The present disclosure is a continuation-application of International (PCT) Patent Application No. PCT/CN2020/131382, filed on Nov. 25, 2020, which claims priority of Chinese Patent disclosure No. 201911244319.8, filed on Dec. 6, 2019, the entire contents of both of which are hereby incorporated by reference.

TECHNICAL FIELD

The present disclosure relates to the field of intelligent devices, and in particular to a head-mounted device.

BACKGROUND

Virtual reality (VR) and augmented reality (AR) technologies may provide a user a visual experience which is comparable to a real scene. The VR and the AR are currently popular fields of research. The VR and the AR scenes are usually displayed by a head-mounted device in order to enable the user to better experience the VR and AR.

The head-mounted device is a wearable device that can be worn on a user's head. After being worn on the head, a display configured for displaying the VR or the AR is located in front of the user's eyes. Content may be displayed in regions of the display of the head-mounted device that correspond to the left eye and the right eye of the user, such that the user may experience the VR or the AR display effect.

The head-mounted device needs to be worn by a tether. While the device is worn, the length of the tether may be excessively loose or tight for the users, and the user may not wear it conveniently and comfortably. Therefore, an adjusting device is needed to adjust the length of the tether.

SUMMARY

According to an aspect of the present disclosure, a head-mounted device is provided and includes: a first housing, including a first receiving cavity and a second receiving cavity separated from each other; two second housings, respectively extending from two opposite sides of the first housing, and the two second housings having two third receiving cavities, the two third receiving cavities being communicated with the first receiving cavity and respectively located on the left and right sides of the first receiving cavity; wherein a part of the first housing having the second receiving cavity extends beyond the second housing; a lacing assembly, comprising a first head band and a second head band, one end of the first head band and one end of the second head band are overlapped and connected in the first receiving cavity and the third receiving cavity to form an overlapping portion, and the other ends of the first head band and the second head band are exposed outside the first receiving cavity; and a tightness adjustment mechanism, including: a ratchet pawl mechanism, accommodated in the first receiving cavity, and the tightness adjustment mechanism is matched with the overlapping portion through the ratchet pawl mechanism to adjust a length of the overlapping portion.

According to another aspect of the present disclosure, a head-mounted device is provided and includes: a host housing; a first housing, disposed opposite to the host housing, and having a first receiving cavity; a second housing, extending from a side of the first housing, and having a second receiving cavities which is spaced apart from the first receiving cavity; wherein the extending length of the first housing is greater than the extending length of the second housing in the same direction; a lacing assembly, comprising a first head band and a second head band, one end of the first head band and one end of the second head band are overlapped and connected in the first receiving cavity to form an overlapping portion, and the other ends of the first head band and the second head band are extended out of the first receiving cavity and connected with the host housing; a ratchet pawl mechanism, accommodated in the first receiving cavity, and matched with the overlapping portion to adjust the length of the overlapping portion; and a knob assembly, matched with the ratchet pawl mechanism to adjust the length of the overlapping portion.

According to still another aspect of the present disclosure, a head-mounted device is provided and includes: a host housing; a first housing, disposed opposite to the host housing, and having a first receiving cavity; a second housing, extending from a side of the first housing, and having a second receiving cavities which is spaced apart from the first receiving cavity; wherein the extending length of the first housing is greater than the extending length of the second housing in the same direction; a lacing assembly, forming a ring-shaped frame with the host housing and the first housing, wherein the lacing assembly comprises a first head band and a second head band, one end of the first head band and one end of the second head band are overlapped and connected in the first receiving cavity to form an overlapping portion, and the other ends of the first head band and the second head band are extended out of the first receiving cavity and connected with the host housing; a ratchet pawl mechanism, accommodated in the first receiving cavity, and is matched with the overlapping portion to adjust the length of the overlapping portion; and a force bearing member, installed on the ring-shaped frame.

According to the present disclosure, a tightness adjustment mechanism, which can adjust the tightness of the first head band and the second head band by adjusting the length of the overlapping portion of the ratchet pawl mechanism.

BRIEF DESCRIPTION OF DRAWINGS

In order to more clearly illustrate technical solutions of embodiments of the present disclosure, the accompanying drawings for the embodiments will be briefly described in the following. Obviously, the drawings in the following show only some of the embodiments of the present disclosure. Any ordinary skilled person in the art may obtain other drawings based on these drawings without any creative work.

DETAILED DESCRIPTION

Technical solutions in the embodiments of the present disclosure will be clearly and completely described below by referring to the accompanying drawings in the embodiments of the present disclosure. Obviously, the described embodiments are only a part but not all of the embodiments of the present disclosure. All other embodiments obtained by an ordinary skilled person in the art based on the embodiments in the present disclosure without making creative work shall fall within the scope of the present disclosure.

The term "embodiments" herein means that a particular feature, a structure, or a property described in an embodiment may be included in at least one embodiment of the present disclosure. Presence of the term at various sections in the specification does not necessarily mean one same embodiment or a separate or an alternative embodiment that is mutually exclusive with other embodiments. The skilled person in the art shall understand explicitly and implicitly that the embodiments described herein may be combined with other embodiments.

To be noted that, the terms "first", "second", and the like are used herein for descriptive purposes only, and shall not be interpreted as indicating or implying relative importance or implicitly specifying the number of technical features indicated. Therefore, the features defined by the "first" and "second" may explicitly or implicitly include one or more of the described features.

Figure 1:
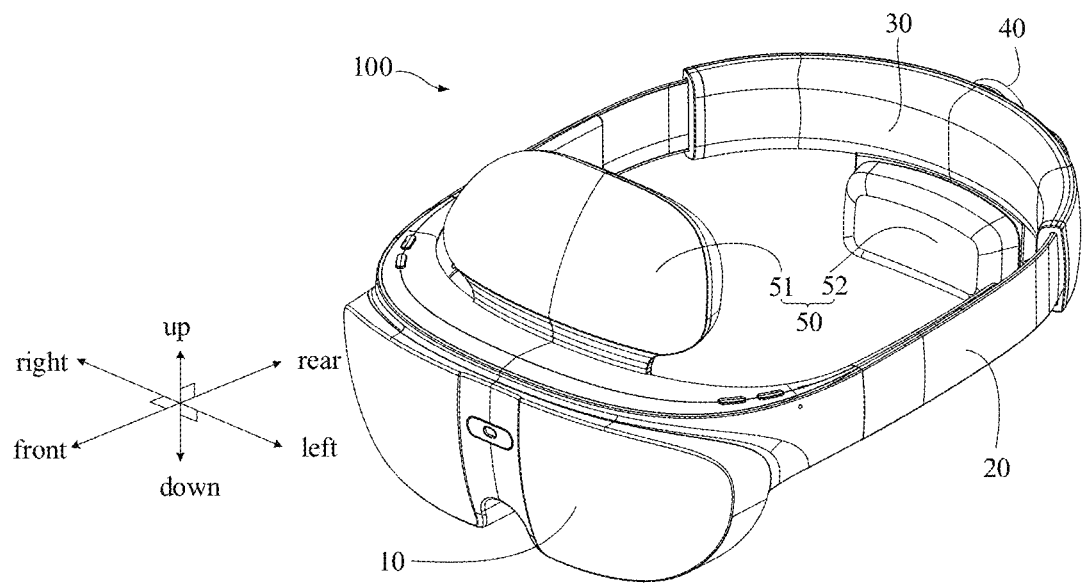
FIG. 1 is a perspective view of a head-mounted device according to an embodiment of the present disclosure.

As shown in FIG. 1, the head-mounted device 100 of the present embodiment may include a first housing assembly 10, a lacing assembly 20 connected to two ends of the first housing assembly 10, a tightness adjustment mechanism 40 connected to the lacing assembly 20, a second housing assembly 30 arranged on the lacing assembly 20 and opposite to the first housing assembly 10, and a force bearing assembly 50 arranged on the first housing assembly 10 and the second housing assembly 30. The first housing assembly 10, the lacing assembly 20 and the second housing assembly 30 may serve as an adjustable frame to enable the head-mounted device 100 to be worn to the head of the user. The force bearing assembly 50 is arranged at each of a top and a bottom of the frame to support a weight of the head-mounted device 100 applied to the user's head.

Figure 2:
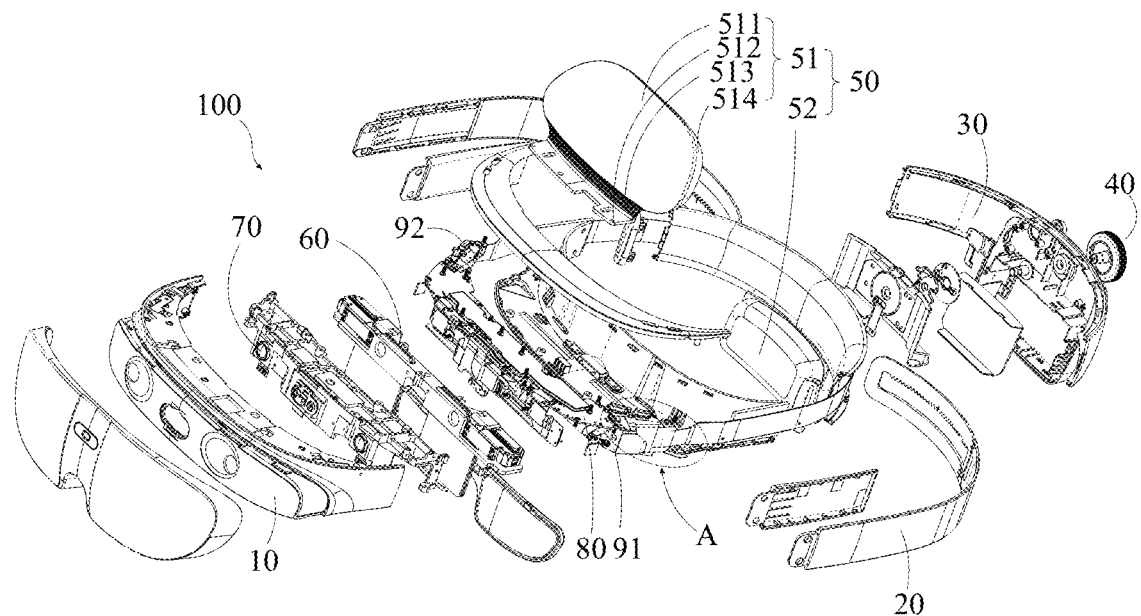
FIG. 2 is an explosive perspective view of the head-mounted device shown in FIG. 1.
Figure 3:
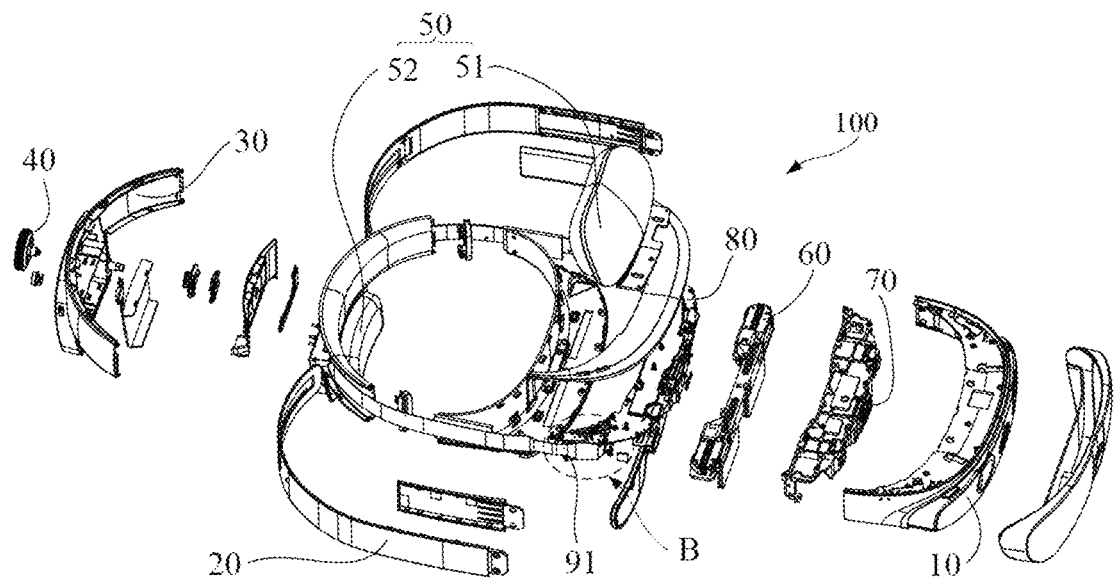
FIG. 3 is an explosive perspective view of the head-mounted device shown in FIG. 1 from another view angle.

As shown in FIGS. 2 and 3, the head-mounted device 100 of the present embodiment may further include a host received in the first housing assembly 10. The host may include an optical assembly 60, a camera assembly 70, a motherboard 80, a speaker assembly 91, a microphone assembly 92, and so on. Since the first housing assembly 10 is configured to receive and protect the host, the first housing assembly 10 may also be referred to as a host housing or a protective housing. The first housing assembly 10 and the host received in the first housing assembly 10 may be referred to as a host assembly. The head-mounted device 100 may be VR glasses, AR glasses, and the like. The AR glasses may be taken as an example in the embodiments of the present disclosure.

In an example of AR glasses, the head-mounted device 100 may be configured to transmit data to an external processing device via signal connection and receive data sent from the external processing device via the signal connection. The signal connection may be wired connection, wireless connection, or a combination thereof. In other examples, however, the head-mounted device 100 may serve as an independent device. That is, data is processed by the head-mounted device 100 itself. The signal connection may be configured to carry any kind of data, such as image data (such as a still image and/or a full motion video, including a 2D image and a 3D image), audios, multimedia, voices, and/or any other type of data. The external processing device may be, such as, a gaming console, a personal computer, a tablet computer, a smart phone, or other type of processing device. The signal connection may be, such as, universal serial bus (USB) connection, Wi-Fi connection, Bluetooth or Bluetooth Low Energy (BLE) connection, Ethernet connection, cable connection, DSL connection, cellular connection (such as 3G, LTE/4G, or 5G), or a combination thereof. In addition, the external processing device may communicate with one or more other external processing devices via a network. The network may be or include, such as, a local area network (LAN), a wide area network (WAN), an intranet, a metropolitan area network (MAN), a global internet, or a combination thereof.

The first housing assembly 10 of the head-mounted device 100 may be configured with a display assembly, an optic element, a sensor, a processor, and so on. In the example of AR glasses, the display assembly may be configured to, for example, project light into the user's eyes, such that an image may overlap on the user's view of a real-world environment. The head-mounted device 100 may further include an ambient light sensor and an electronic circuit system to control at least some of the above components and perform associated data processing functions. The electronic circuit system may include, such as, one or more processors and one or more memories.

The Lacing Assembly 20

Figure 4:
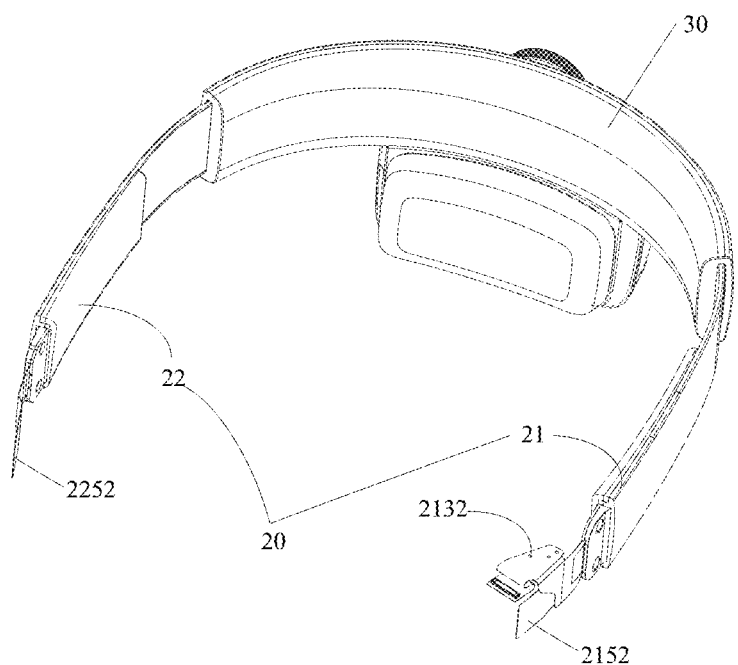
FIG. 4 is a perspective view of a lacing assembly and a second housing assembly shown in FIG. 1.

As shown in FIG. 4, FIG. 4 shows a perspective view of the lacing assembly 20 and the second housing assembly 30 according to an embodiment of the present disclosure. The lacing assembly 20 may include two head bands: a first head band 21 and a second head band 22.

As shown in FIGS. 1 and 4, an end of the first head band 21 is connected to a corresponding end of the first housing assembly 10. The other end of the first head band 21 extends into the second housing assembly 30 from a corresponding end of the second housing assembly 30 and is further connected to the tightness adjustment mechanism 40. The second head band 22 may be configured in a similar manner to the first head band 21.

The First Head Band 21 of the Lacing Assembly 20

Figure 5:
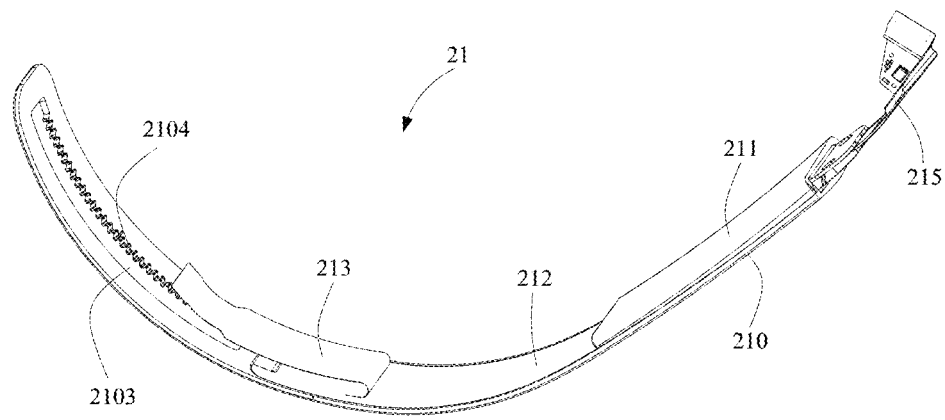
FIG. 5 is a perspective view of a first head band of the lacing assembly shown in FIG. 4.
Figure 6:
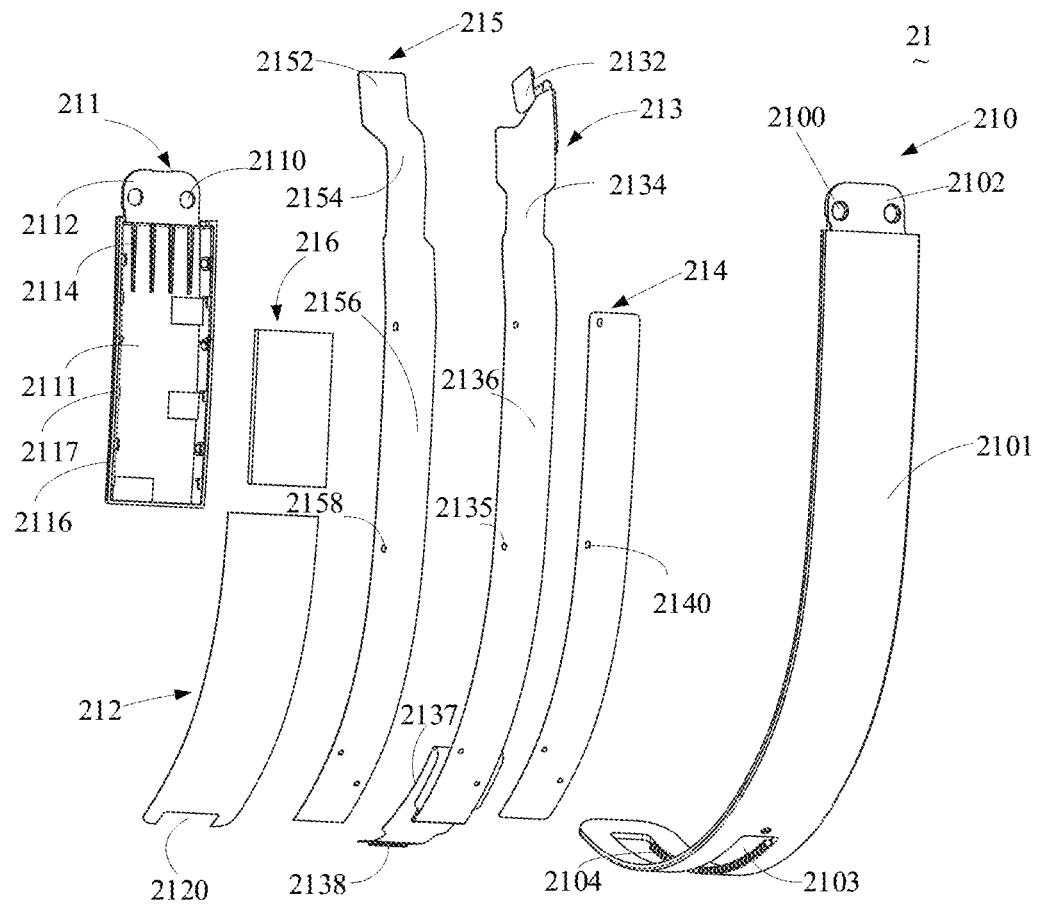
FIG. 6 is an explosive perspective view of the first head band shown in FIG. 5.

As shown in FIGS. 5 and 6, a perspective view and an exploded view of the first head band 21 according to an embodiment of the present disclosure are shown. The first head band 21 may include a first band body 210, a first band cover 211 buckled to the first band body 210, a first flexible strip 212, a power supply FPC 213, a protection sheet 214, and a heat dissipation sheet 215. The first flexible strip 212, the power supply FPC 213, the protection sheet 214, and the heat dissipation sheet 215 are disposed between and pressed by the first band body 210 and the first band cover 211.

The first band body 210 may be made of flexible material and may be arbitrarily bent. The first band body 210 may substantially strip-shaped. The first band body 210 may include a first body portion 2101 and a first mounting portion 2102 extending from an end of the first body portion 2101.

The first body portion 2101 has a uniform width. An end of the first body portion 2101 away from the first mounting portion 2102 may define a length adjustment hole 2103. The length adjustment hole 2103 may be a strip-shaped through hole. A first sawtooth wave 2104 extending along a length of the through hole is arranged on a wall of the length adjustment hole 2103 and is configured to engage with the tightness adjustment mechanism 40.

Figure 7:
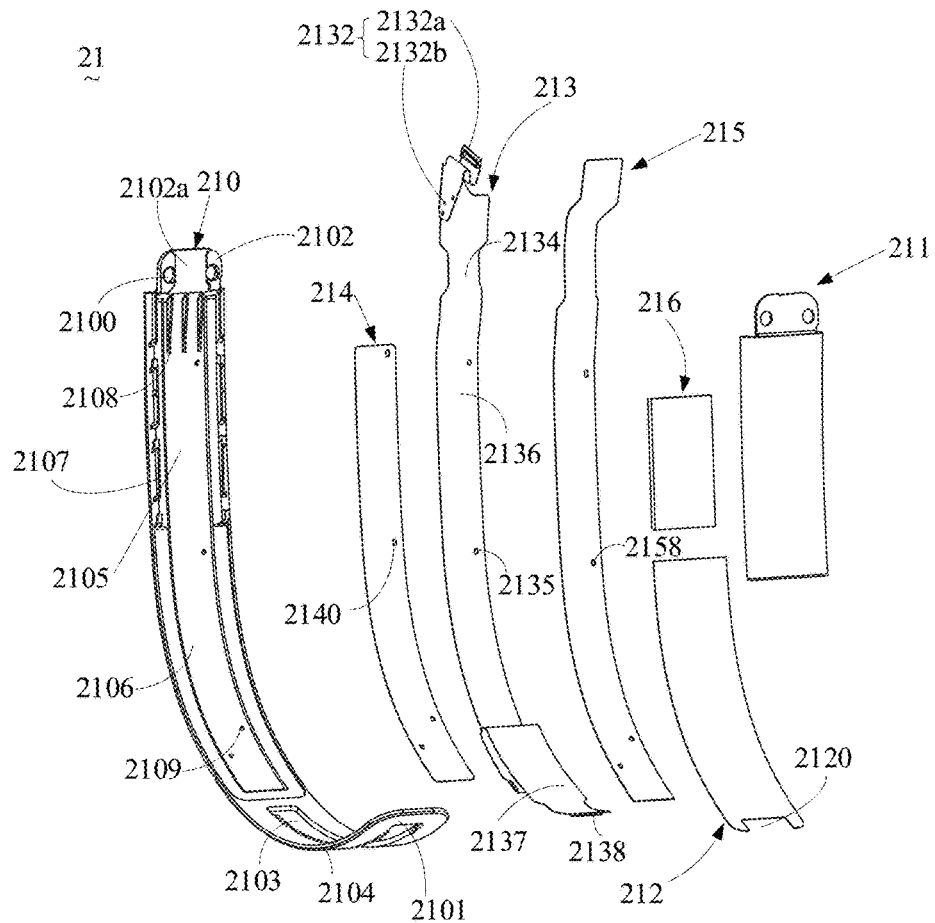
FIG. 7 is similar to FIG. 6, showing an explosive perspective view of the first head band from another view angle.

As shown in FIG. 7, an exploded view of the first head band 21 from another view angle according to the present disclosure is shown. A side of the first body portion 2101 that is pressed against the first band cover 211 may define an elongated recess, and a shape of the elongated recess may be the same as a shape of the first head band 21. The elongated recess may be divided into two recesses: a first recess 2105 and a second recess 2106 communicating with the first recess 2105. A depth of the first recess 2105 is the same as a depth of the second recess 2106, but a width of the first recess 2105 is greater than that of the second recess 2106. The recess extends from a position adjacent to the length adjustment hole 2103 to a position where the first mounting portion 2102 is arranged. The second recess 2106 is a stepped recess. An outermost step of the recess may be configured to receive the first flexible strip 212. Each of two edges of the first body portion 2101 near two side walls of the first recess 2105 is arranged with a first connector 2107. In an embodiment, the first connector 2107 may be a plurality of hooks that are evenly distributed and spaced apart from each other. A first fixing portion 2108 is arranged on the wall of the first recess 2105. The first fixing portion 2108 may be a plurality of ribs, and a thickness of each of the plurality of ribs changes gradually. A top surface of each of the plurality of ribs may be inclined. An end of each of the plurality of ribs abuts against the first mounting portion 2102.

A plurality of first restriction posts 2109 are arranged on the wall of the recess of the first body portion 2101 to fix the power supply FPC 213, the protection sheet 214, and the first heat dissipation sheet 215.

The first mounting portion 2102 may define two first connection holes 2100. The first mounting portion 2102 may define a recess 2102a between the two first connection holes 2100.

As shown in FIG. 6, the first band cover 211 may be made of rigid material. The first band cover 211 may buckle with a side of the first band body 210 near the first mounting portion 2102, and press an end of the first flexible strip 212 near the first mounting portion 2102 tightly.

The first band cover 211 may include a first body 2111 and a first assembly portion 2112 extending from an end of the first body 2111 away from the first flexible strip 212.

A width of the first body 2111 may be uniform. A shape of the first body 2111 may correspond to a shape of the first body portion 2101. A length of the first body 2111 may be less than that of the first body portion 2101. Two side edges along a width direction of the first body 2111 may extend towards the above-mentioned first body portion 2101 to form two first side walls 2116. The two first side walls 2116 have two inner faces that face each other, and each of the two inner faces is arranged with a second connector 2117. The second connector 2117 may be engaged with the first connector 2107 to fix the first band cover 211 to the first band body 210. An end of the first body 2111 connected to the first assembly portion 2112 may be arranged with a second fixing portion 2114. When the first band cover 211 is buckled to the first band body 210, the first fixing portion 2108 of the first band body 210 may be engaged with the second fixing portion 2114 of the first band cover 211 to fix and tightly press the power supply FPC 213 and the first heat dissipation sheet 215 between the first band body 210 and the first band cover 211. A structure of the second fixing portion 2114 may be similar to that of the first fixing portion 2108. The second fixing portion 2114 may also be a plurality of ribs having gradually changed thicknesses. A top surface of each of the plurality of ribs 2114 may be inclined. An end of the plurality of ribs 2114 may abut against the first assembly portion 2112.

A shape of the first assembly portion 2112 may be the same as a shape of the first mounting portion 2102. The first assembly portion 2112 may define a second connection hole 2110. When the first assembly portion 2112 is attached to the first mounting portion 2102, the first connection hole 2100 is aligned to and communicated with the second connection hole 2110, and a penetration hole is defined at a position where the recess 2102a is defined.

The first flexible strip 212 may be made of flexible material and may be arbitrarily bent. The first flexible strip 212 may be substantially strip-shaped. Material of the first flexible strip 212 may be the same as the material of the first band body 210. The first flexible strip 212 may be adhered to a wall of the second recess 2106 of the first band body 210 by glue. In this way, an outer surface of the first flexible strip 212 may align with an outer surface of the first band body 210. That is, a surface near the user's head is smooth. An end of the first flexible strip 212 defines a notch 2120. When the first flexible strip 212 is adhered to the wall of the second recess 2106, the first flexible strip 212 and the first band body 210 cooperatively define a first through hole at a position where the notch 2120 is defined, and the first through hole communicates with the second recess 2106 to allow the power supply FPC 213 to be threaded out.

As shown in FIGS. 5, 6 and 7, a shape of the power supply FPC 213 may fit with the first band body 210. A length of the power supply FPC 213 may be greater than a length of the first band body 210. Two ends of the power supply FPC 213 may extend beyond two ends of the first band body 210. The power supply FPC 213 may include a first electrical connection portion 2132, a power supply FPC neck portion 2134, a power supply FPC body 2136, a movable portion 2137 and a second electrical connection portion 2138. The first electrical connection portion 2132 may extend into the first housing assembly 10 and connect to the motherboard 80 and/or the microphone assembly 92. The power supply FPC neck portion 2134 may be received in the penetration hole (which is defined at the position where the recess 2102a is defined) and connected to the first electrical connection portion 2132. The power supply FPC body 2136 may be fixedly received in the first recess 2105 and the second recess 2106. The movable portion 2137 extend through the first through hole to be disposed outside the second recess 2106. The second electrical connection portion 2138 may be arranged at an end of the movable portion 2137 and connected to a battery 35.

Figure 8:
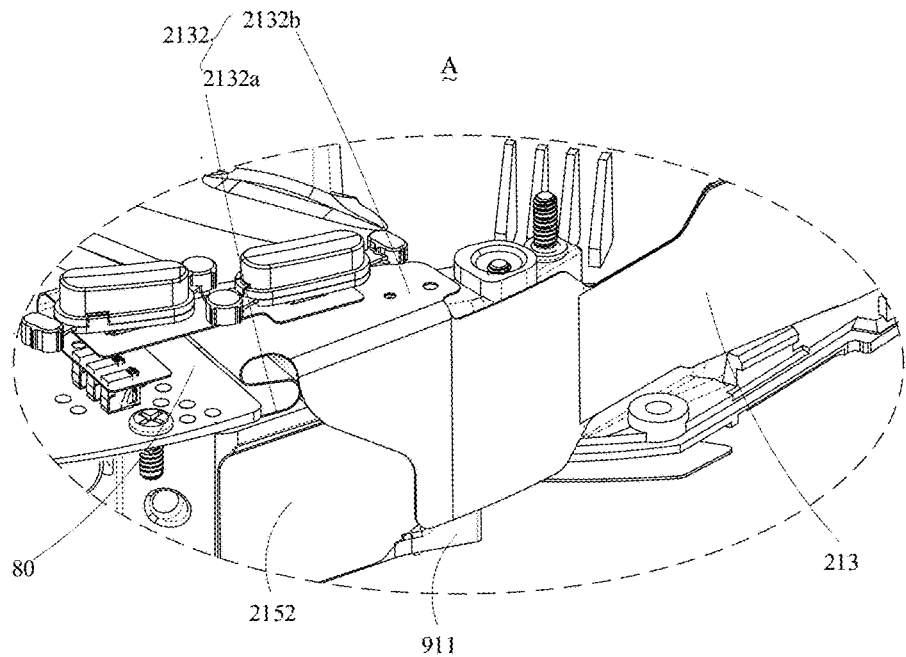
FIG. 8 is an enlarged perspective view of a portion A shown in FIG. 2.
Figure 9:
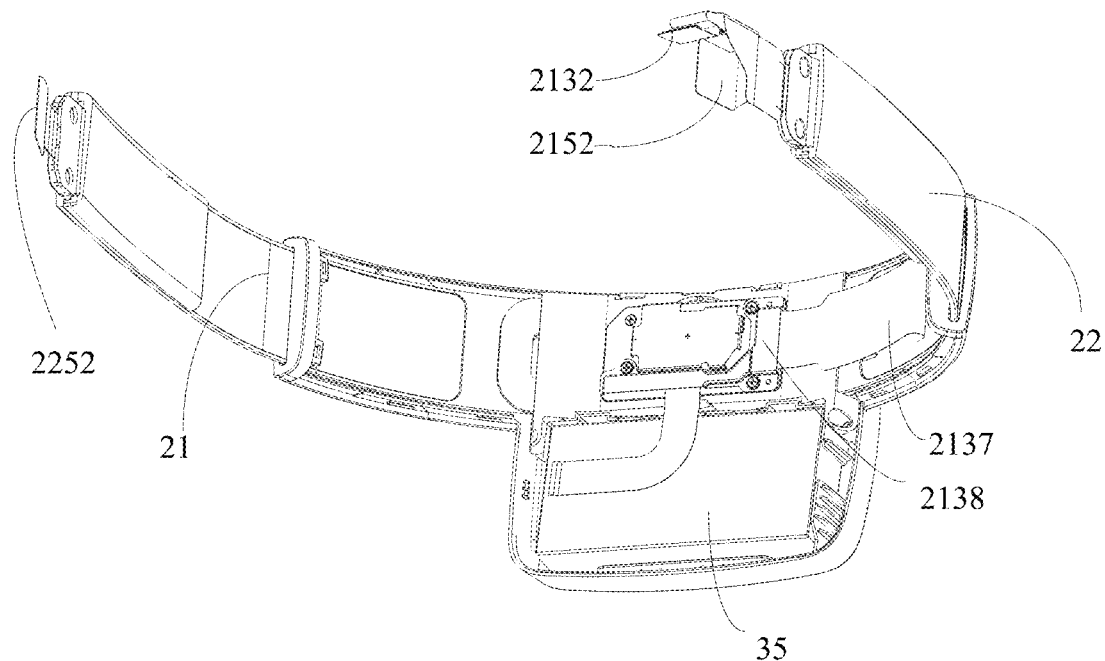
FIG. 9 is similar to FIG. 4, showing engagement between a power FPC of the lacing assembly and related components of the second housing assembly.

As shown in FIG. 8, an enlarged view of a portion in a circle A of FIG. 2 is shown. FIG. 8 shows a schematic view of connection between the first electrical connection portion 2132 and circuit elements when the lacing assembly 20 is extended into the first housing assembly 10. The first electrical connection portion 2132 includes a wiring portion 2132a connected to the motherboard 80 and another wiring portion 2132b connected to the microphone assembly 92. Each of the wiring portion 2132a and the second electrical connection portion 2138 may be a plugging interface, and connection may be achieved by plugging. For example, as shown in FIG. 8, the motherboard 80 is connected to the wiring portion 2132a by plugging. For example, as shown in FIG. 9, the second electrical connection portion 2138 is connected to the battery 35 by plugging.

As shown in FIGS. 6 and 7, a width of the power supply FPC neck portion 2134 is less than a width of each of two power supply FPC portions adjacent to the neck portion, such as a width of the power supply FPC body 2136. Further, as shown in FIG. 4, the power supply FPC neck portion 2134 is fixedly received in the penetration hole, preventing the power supply FPC 213 from being loose.

As shown in FIGS. 6 to 7, the power supply FPC body 2136 defines a first insertion hole 2135. When the power supply FPC body 2136 is received in the first recess 2105 and the second recess 2106, the first restriction post 2109 may be received in the first insertion hole 2135 to fix the power supply FPC body 2136.

A shape of the protection sheet 214 may fit with a shape of the first recess 2105 and the second recess 2106, such that the protection sheet 214 may be received in the recesses. For example, the protection sheet 214 may be received in an innermost step of the second recess 2106 and the first recess 2105. The protection sheet 214 may define a plurality of second insertion holes 2140. The first restriction post 2109 may be received in each of the plurality of second insertion holes 2140 to fix the protection sheet 214. The protection sheet 214 may be received in the first recess 2105 and the second recess 2106 to directly contact the first body portion 2101, preventing the power FPC body 2136 from being directly contact the first body portion 2101.

A shape of the first heat dissipation sheet 215 may be similar to that of the power supply FPC 213 and may be disposed between the first band cover 211 and the power supply FPC 213. The first heat dissipation sheet 215 may include a first attaching portion 2152 extending into the first housing assembly 10, a first heat dissipating neck portion 2154 received in the penetration hole and connected to the first attaching portion 2152, and a first heat dissipating body 2156 fixedly received in the first recess 2105 and the second recess 2106. For example, as shown in FIG. 8, the first attaching portion 2152 is attached to a side wall of a speaker body 9132.

A width of the first heat dissipating neck portion 2154 is less than a width of each of two portions of the heat dissipation sheet adjacent to the neck portion, such as a width of the first heat dissipating body 2156. Further as shown in FIG. 4, the first heat dissipating neck portion 2154 is fixedly received in the penetration hole, preventing the first heat dissipation sheet 215 from being loose. The first heat dissipating body 2156 may define a third insertion hole 2158. When the first heat dissipating body 2156 is received in the first recess 2105 and the second recess 2106, the first restriction post 2109 is received in the third insertion hole 2158 to fix the first heat dissipating body 2156. The first fixing portion 2108 and the second fixing portion 2114 may cooperatively press tightly against and fix the first heat dissipating body 2156 between the first band body 210 and the first band cover 211.

A filling 216 may be disposed between the first heat dissipation sheet 215 and the first band cover 211. The filling 216 may be a foam to fill a space between the first band cover 211 and the first band body 210. Alternatively, the filling 216 may be thermally conductive material, improving thermal conductivity of the first heat dissipation sheet 215.

When assembling the first head band 21, as shown in FIG. 6 and FIG. 7, the protection sheet 214, the power supply FPC 213, and the first heat dissipation sheet 215 may be laminated in sequence, such that the second insertion hole 2140, the first insertion hole 2135, and the third insertion hole 2158 are aligned in sequence. Subsequently, the protection sheet 214, the power supply FPC 213, and the first heat dissipation sheet 215 may be received in the first recess 2105 and the second recess 2106 of the first band body 210, enabling the first restriction post 2109 to be received into the second insertion hole 2140, the first insertion hole 2135, and the third insertion hole 2158 in sequence. The first flexible strip 212 is embedded in and glued to the outermost step of the second recess 2106, such that the first flexible strip 212 and the first body portion 2101 of the first band body 210 may cooperatively define the first through hole at a position where the notch 2120 is defined. In this way, the movable portion 2137 of the power supply FPC 213 may extend through the first through hole. In addition, the power supply FPC neck portion 2134 of the power supply FPC 213 and the first heat dissipating neck portion 2154 are received in the recess 2102a. The filling 216 may be placed on the first body 2111 of the first band cover 211, and the first band cover 211 may buckle to the first band body 210, allowing the first connector 2107 to be connected to the second connector 2117. In addition, the first mounting portion 2102 may buckle to the first assembly portion 2112 to form a connection portion to connect with the corresponding end of the first housing assembly 10. In this way, assembling the first head band 21 may be completed.

It shall be understood that the first band cover 211 is buckled to the first band body 210. The first band cover 211 and a corresponding portion of the first band body 210 cooperatively define a receiving cavity. Further, it is the first body portion 2101 that is buckled to the first band cover 211 at the position of the first recess 2105 to define the receiving cavity. The protection sheet 214, the power supply FPC 213, the first heat dissipation sheet 215 and the filling 216 may be received in the receiving cavity. The second recess 2106 may communicate with the receiving cavity.

The Second Head Band 22 of the Lacing Assembly 20

Figure 10:
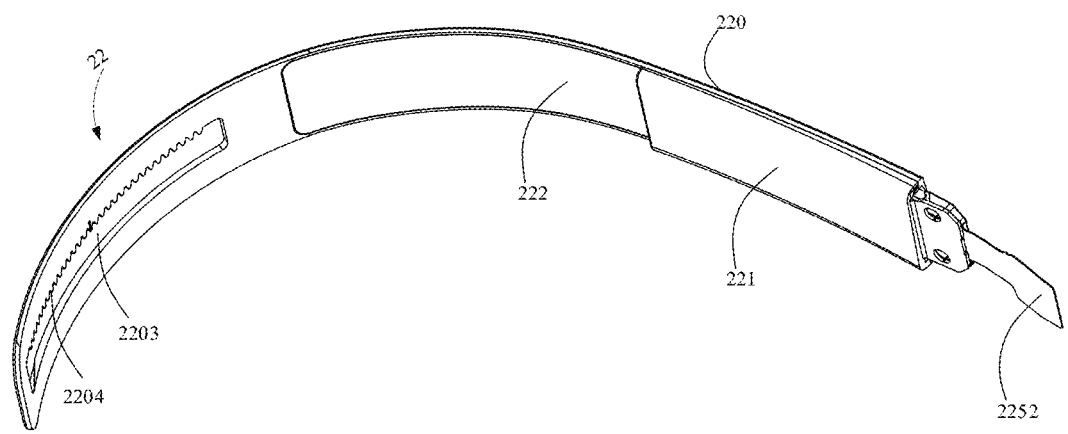
FIG. 10 is a perspective view of the second head band of the lacing assembly shown in FIG. 4.
Figure 11:
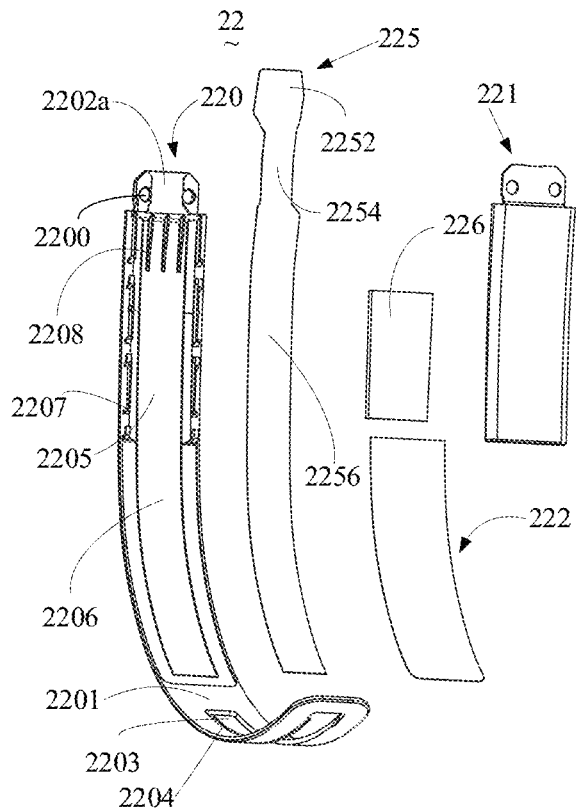
FIG. 11 is an explosive perspective view of the second head band shown in FIG. 10.

As shown in FIG. 10 and FIG. 11, a perspective view and an exploded view of the second head band 22 according to the present disclosure are shown. The second head band 22 may be similar to the first head band 21. However, the second headband 22 is not arranged with the power supply FPC and the protection sheet. The second head band 22 may include a second band body 220, a second band cover 221, a second flexible strip 222, and a second heat dissipation sheet 225. The second flexible strip 222 and the second heat dissipation sheet 225 are pressed between the second band body 220 and the second band cover 221. A structure of the second band body 220 may be substantially the same as that of the first band body 210, as shown in FIG. 11, which will not be described in detail herein, but main components are listed here. Detailed engagement and function of the second band body 220 may refer to that of the first band body 210. The second band body 220 may include a second body portion 2201 and a second mounting portion 2202. The second body portion 2201 defines a length adjustment hole 2203, a second sawtooth wave 2204, a first recess 2205, and a second recess 2206. A first connector 2207 may be arranged on each of two edges of the second body portion 2201 near side walls of the first recess 2205. A first fixing portion 2208 may be arranged on a wall of the first recess 2205 adjacent to the second mounting portion 2202. The second mounting portion 2202 defines two first connection holes 2200 and defines a recess 2202a between the two first connection holes 2200.

Figure 12:
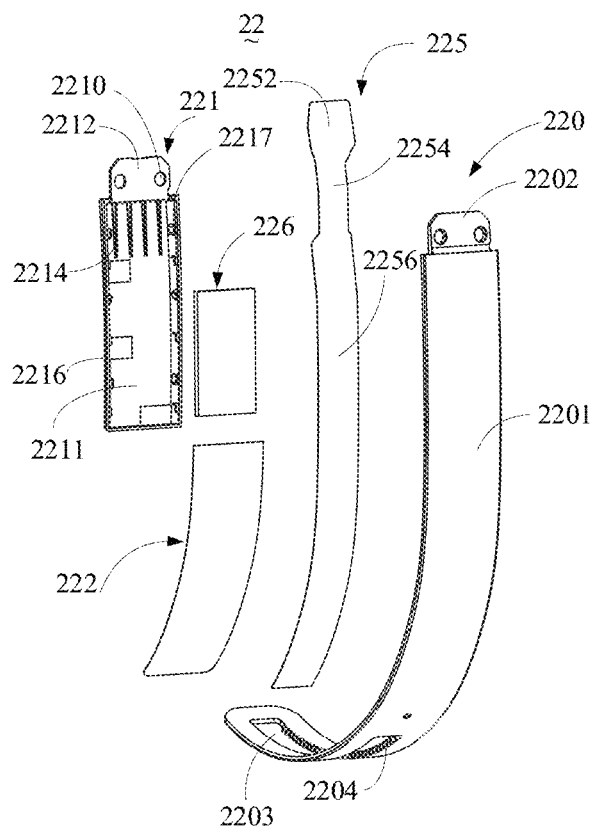
FIG. 12 is similar to FIG. 11, showing an explosive perspective view of the second head band from another view angle.

As shown in FIG. 12, an exploded view of the second head band 22 from another view angle is shown. Configuration of the second band cover 221 may substantially be the same as that of the first band cover 211, and will not be described in details herein, but main components will be listed. Detailed engagement and function of the second band cover 221 may refer to the first band cover 211. The second band cover 221 may include a second body 2211 and a second assembly portion 2212. The second body 2211 has a second fixing portion 2214, a second side wall 2216 and a second connector 2217. The second assembly portion 2212 may define two second connection holes 2210.

The second flexible strip 222 may be made of flexible material and may be arbitrarily bent. The second flexible strip 222 may substantially be strip-shaped. Material of the second flexible strip 222 may be the same as material of the second band body 220. The second flexible strip 222 may be adhered to a wall of the second recess 2206 of the second band body 220 by glue or the like. In this way, an outer surface of the second flexible strip 222 may align with an outer surface of the second band body 220, that is, a surface near the user's head may be smooth.

Figure 13:
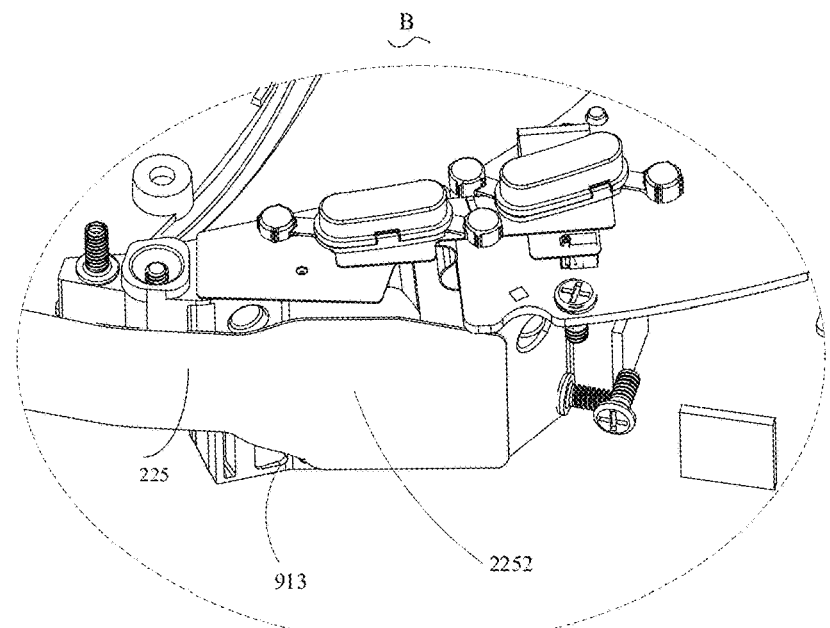
FIG. 13 is an enlarged perspective view of a portion B shown in FIG. 3.

Configuration of the second heat dissipation sheet 225 may substantially be the same as that of the first heat dissipation sheet 215. The second heat dissipation sheet 225 may include a second attaching portion 2252, a second heat dissipating neck portion 2254, and a second heat dissipating body 2256. The second attaching portion 2252 may extend into the first housing assembly 10. The second heat dissipating neck portion 2254 may be received in the penetration hole and connected to the second attaching portion 2252. The second heat sink body 2256 may be fixedly received in the first recess 2205 and the second recess 2206. As shown in FIG. 13, the second attaching portion 2252 is attached to a side wall of a speaker body 9132 of the speaker assembly 91.

A width of the second heat dissipating neck portion 2254 is less than a width of any portion of the second heat dissipation sheet adjacent to the neck portion, such as a width of the second heat dissipating body 2256. As shown in FIG. 4, the second heat dissipating neck portion 2254 is fixedly received in the penetration hole, preventing the second heat dissipation sheet 225 form being loose.

When the second heat dissipating body 2256 is received in the first recess 2205 and the second recess 2206, the first fixing portion 2208 and the second fixing portion 2214 cooperatively fix the second heat dissipating body 2256 disposed between the second band body 220 and the second band cover 221.

A filling 226 may be disposed in a region of the second band cover 221 where the second connector 2217 is arranged. The filling 226 may be disposed between the second heat dissipation sheet 225 and the second band cover 221. The filling 226 may be a foam to fill a space between the second band cover 221 and the second band body 220. Alternatively, the filling 226 may be thermally conductive material, improving thermal conductivity of the second heat dissipation sheet 225.

When assembling the second head band 22, as shown in FIGS. 11 and 12, the second heat dissipation sheet 225 may firstly be placed in the first recess 2205 and the second recess 2206 of the second band body 220. Subsequently, the second flexible strip 222 is embedded in an outermost step of the second recess 2206 by glue. The second heat dissipating neck portion 2254 is then placed in the recess 2202a. At this moment, the second filling 226 is placed on the second band cover 221, and the second band cover 221 is buckled to the second band body 220, enabling the first connector 2207 to be connected to the second connector 2217. In addition, the second mounting portion 2202 is buckled to the second assembly portion 2212 to form a connection portion to connect to a corresponding end of the first housing assembly 10. In this way, assembling the second head band 22 may be completed.

It shall be understood that the second band cover 221 is buckled to the second band body 220, and the second band cover 221 and a corresponding portion of the second band body 220 cooperatively define a receiving cavity. A portion of the second body portion 2201 where the first recess 2205 is defined is buckled to the second band cover 221 to define the receiving cavity. The second heat dissipation sheet 225 and the filling 226 may be received in the receiving cavity. The second recess 2206 is communicated to the receiving cavity.

Assembling relationships between the lacing assembly 20 and the first housing assembly 10 are described as follows.

As shown in FIGS. 1, 5, 6, 7 and 4, when the first head band 21 is assembled to the first housing assembly 10, the first housing assembly 10 is firstly connected to the connection portion, such as the first connection hole 2100 and the second connection hole 2110, of the first head band 21. Similarly, the second head band 22 may be assembled to the first housing assembly 10.

Position relationships and connection relationships of the first heat dissipation sheet 215, the second dissipation sheet 225, and the power supply FPC 213 inside the first housing assembly 10 may be referred to FIG. 2, FIG. 3, FIG. 8, and FIG. 13. The wiring portion 2132a of the power supply FPC 213 may be connected to a PCB of the motherboard 80, such as by soldering and the like. The wiring portion 2132b of the power supply FPC 213 may be connected to a first microphone of the microphone assembly 92, such as by soldering and the like. The first heat dissipation sheet 215 may extend into the first housing assembly 10. The first attaching portion 2152 is attached to the outer side wall of the speaker body 9112 of the speaker assembly 91. The second heat dissipation sheet 225 may extend into the first housing assembly 10. The second attaching portion 2252 is attached to the outer wall of the speaker body 9132 of the speaker assembly 91.

The number, structures, and positions of the heat dissipation sheet, the power supply FPC 213, the protection sheet 214 and the filling received in the first head band 21 and the second head band 22 may be adjusted based on actual needs. For example, the first head band 21 and the second head band 22 may be adjusted to be receiving the heat dissipation sheet, the power supply FPC 213, the protection sheet 214 and the filling in an inside of the first head band 21 and the second head band 22. Of course, according to the actual situation, more components may be received in the inside of the first head band 21 and the second head band 22, or some components received in the inside of the first head band 21 and the second head band 22 may be omitted. For example, an isolation sheet may be received between the heat dissipation sheet and the power supply FPC. For example, the first headband 21 and the second headband 22 may be adjusted to be receiving the heat dissipation sheet only. For example, one of the first head band 21 and the second head band 22 may be a normal head band defining the length adjustment hole only. Structures of the first head band 21 and the second head band 22 may also be adjusted according to the components received therein.

It shall be understood that the first head band 21 and the second head band 22 may be integrated as a one-piece structure, i.e., configured as one head band. For example, one end may be overlapped with the other end, and a middle portion may be connected to the host housing. A length of the overlapped portion may be adjusted to achieve tightness adjustment of the lacing assembly 20. When the first head band 21 and the second head band 22 are configured as one head band, other connection manners may also be applied, which will not be limited here.

The Second Housing Assembly 30

Figure 14:
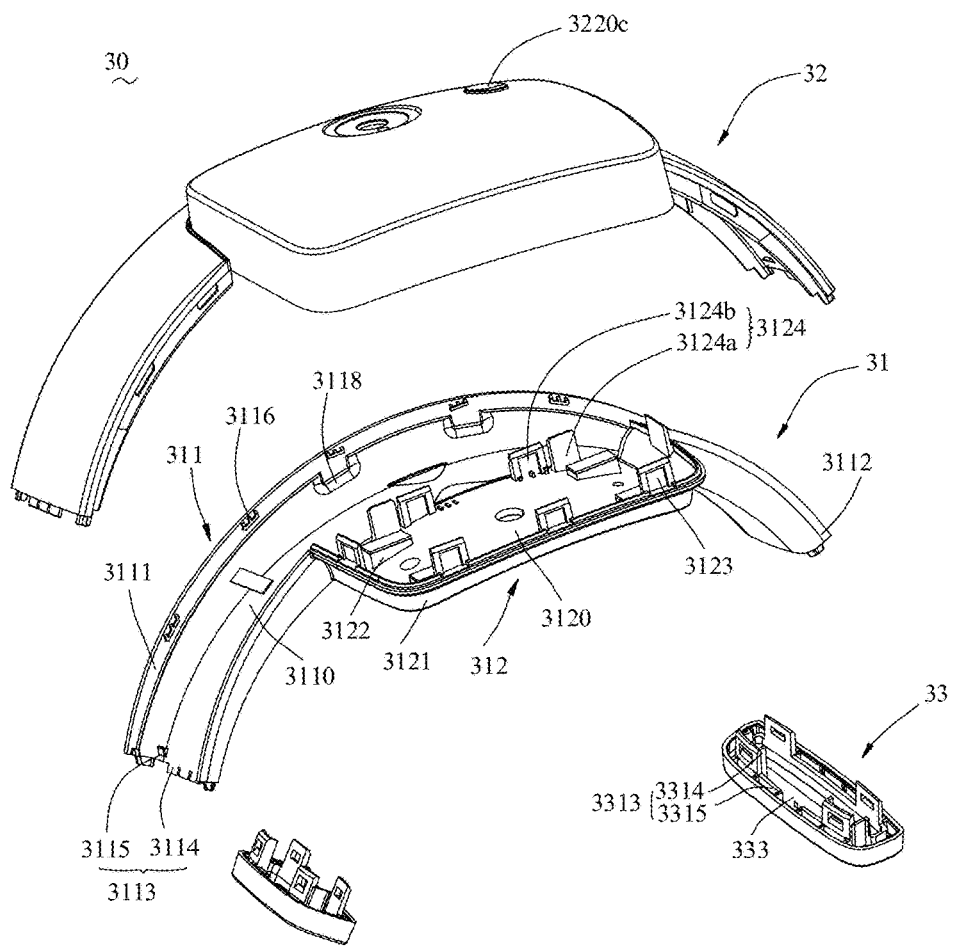
FIG. 14 is an explosive perspective view of the second housing assembly.
Figure 15:
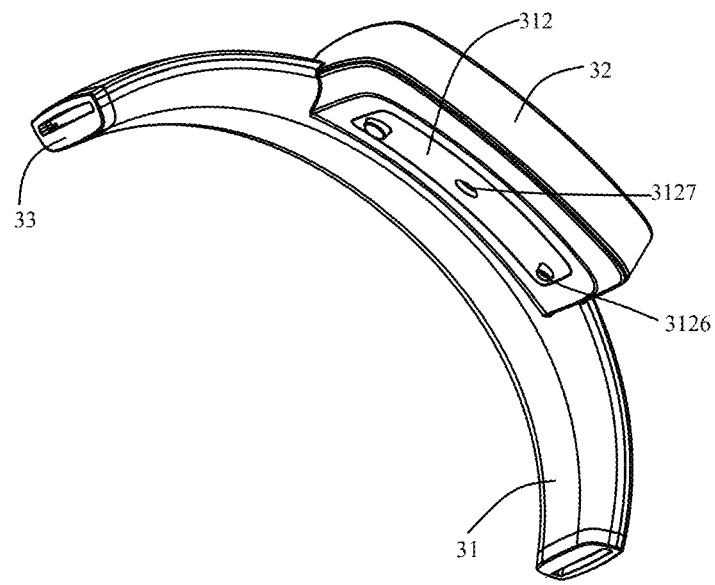
FIG. 15 is a perspective view of the second housing assembly.

As shown in FIG. 14 and FIG. 15, an exploded view and a perspective view of the second housing assembly 30 according to an embodiment are shown. The second housing assembly 30 may include a bottom front housing 31, a bottom rear housing 32, and a connector 33 connecting the bottom front housing 31 and the bottom rear housing 32. The second housing assembly 30 may receive the lacing assembly 20 and the tightness adjustment mechanism 40.

The Bottom Front Shell 31 of the Second Housing Assembly 30

As shown in FIG. 14, the bottom front housing 31 may be made of rigid material. The bottom front housing 31 may include a first channel housing 311 and a first power housing 312 extending from the first channel housing 311 downwardly (the downward direction may refer to a direction indication shown in FIG. 1).

The first channel housing 311 may be curved and may be strip-shaped to match a shape of the user's head, facilitating the user to wear the device. An inner surface and an outer surface of the first channel housing 311 may be smooth and curved. The first channel housing 311 may include a strip-shaped and curved body 3110 and a first convex edge 3111 and a second convex edge 3112. The first convex edge 3111 and the second convex edge 3112 may extend from two long edges of the body 3110, bending towards the bottom rear housing 32. The first convex edge 3111 is disposed above the body 3110 and the second convex edge 3112 is disposed below the body 3110.

A third buckling member 3113 may be arranged on each of two opposite ends of the body 3110. The third buckling member 3113 may include a plurality of protrusion 3114 and a plurality of bumps 3115. The plurality of protrusion 3114 extend from an edge end of the body 3110 outwardly. The plurality of bumps 3115 are adjacent to the edge end. The bumps 3115 may be arranged on a surface facing the bottom rear housing 32 or a surface away from the bottom rear housing 32.

A first buckling member 3116 may be arranged on each of an inner side of the first convex edge 3111 facing the second convex edge 3112 and an inner side of the second convex edge 3112 facing the first convex edge 3111. The first buckling member 3116 may be a plurality of protrusions evenly distributed.

An edge of the body 3110 connected to the first convex edge 3111 may define a plurality of recesses 3118. The plurality of recesses 3118 may locate at a central portion of one of the two long edges of the body 3110 and at a position directly facing the first power housing 312. The plurality of recesses 3118 are defined to avoid corresponding components arranged on the bottom rear housing 32.

The first power housing 312 may include a first power housing body 3120 and a convex edge 3121. The first power housing body 3120 may extend outwardly from a middle portion of the other one of the two long edges that is arranged with the second convex edge 3112 of the body 3110. The convex edge 3121 is bent from an outer edge of the first power housing body 3120 towards the bottom rear housing 32. That is, the second convex edge 3112 is not arranged at a position where the first power housing body 3120 is connected to the body 3110 of the first channel housing 3111. The second edge 3112 is interrupted at the middle of the long edge of the body 3110 where the second convex edge 3112 is arranged. The two ends of the second convex edge 3112 are formed at the position where the second convex edge 3112 is interrupted. The two ends are connected to the convex edge 3121 of the first power housing 312.

The first power housing body 3120 may be rectangular. A surface of the first power housing body 3120 facing the bottom rear housing is arranged with a compensation structure. The compensation structure includes four tabs 3122. A thickness of each of the four tabs 3122 gradually changes. The four tabs 3122 are disposed at locations near four corners of the first power housing body 3120. Surfaces of the four tabs 3122 facing the bottom rear housing 32 are on a same plane for carrying the battery 35 (as shown in FIG. 9).

The first power housing body 3120 is arranged with two pairs of first buckling structures 3124. The two pairs of first buckling structures 3124 are arranged between two tabs 3122 of the body 3110 near the first channel housing 311 and the body 3110. The two pairs of first buckling structures 3124 may include two restriction plates 3124*a* and two buckling plates 3124*b*. The two restriction plates 3124*a* are spaced apart from each other. The two buckling plates 3124*b* are disposed between the two restriction plates 3124*a* and misalign with the two restriction plates 3124*a*. One buckling plate 3124*b* is disposed near a corresponding restriction plate 3124*a*. The buckling plate 3124*b* and an adjacent restriction plate 3124*a* (the corresponding restriction plate 3124*a*) serve as a pair of first buckling structure 3124 for positioning and buckling with corresponding components on the bottom rear housing 32, such that the first power housing 312 may be separated from the first channel housing 311.

The convex edge 3121 at a lower portion of the first power housing may be arranged with a second buckling member 3123 facing the bottom rear housing 32. The second buckling member 3123 may be a plurality of tabs, and the plurality of tabs may define a plurality of recesses.

As shown in FIG. 15, a face of the first power housing body 3120 facing the first housing assembly 10 may be arranged with a connection member 3126. In an embodiment, the connection member 3126 may be two posts. The face of the first power housing body 3120 may define a through hole 3127 between the two posts.

The Bottom Rear Housing 32 of the Second Housing Assembly 30

Figure 16:
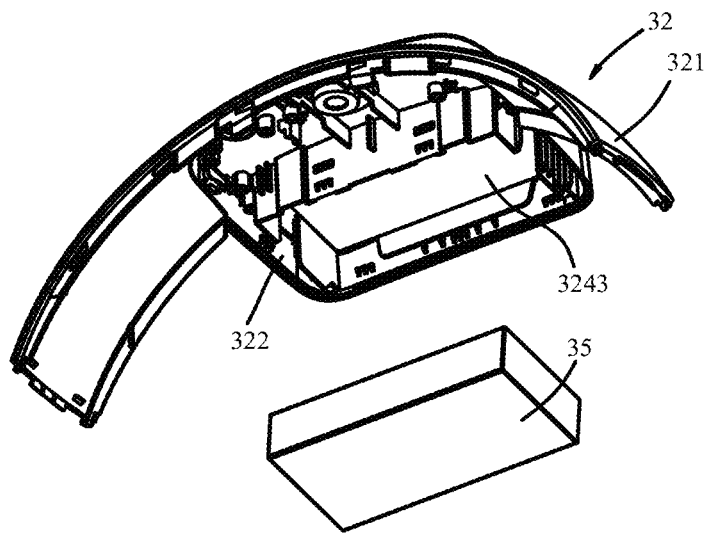
FIG. 16 is a perspective view of a bottom rear shell of the second housing assembly shown in FIG. 14 and shows engagement between the bottom rear shell and a battery.

As shown in FIG. 16, the bottom rear housing 32 may be made of rigid material. The bottom rear housing 32 may include a second channel housing 321 corresponding to the above-mentioned first channel housing 311 and a second power housing 322 corresponding to the above-mentioned first power housing 312. The battery 35 may be mounted inside the second power housing 322. The second power housing 322 and the battery 35 mounted therein may form a power supply assembly.

Figure 17:
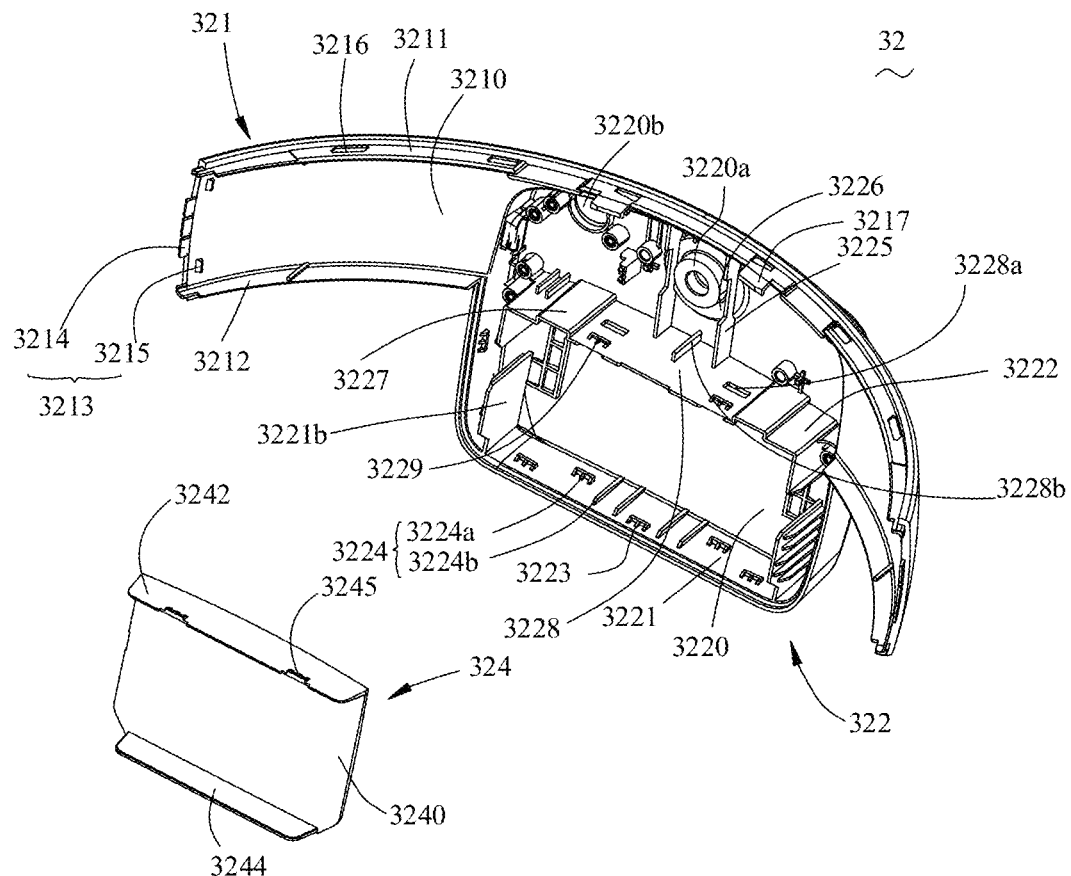
FIG. 17 shows engagement between the bottom rear shell and a battery support shown in FIG. 16.

As shown in FIG. 17, a shape and configuration of the second access housing 321 may substantially be similar to that of the first channel housing 311, such that the first channel housing 311 and the second channel housing 321 may be engaged with each other. The second channel housing 321 may be strip-shaped and curved. The second channel housing 321 may include a strip-shaped and curved body 3210, a first convex edge 3211 and a second convex edge 3212. The first convex edge 3211 and the second convex edge 3212 may extend from two long edges of the body 3210, bending towards the bottom front housing 31. The first convex edge 3211 is disposed above the body 3210, and the second convex edge 3212 is disposed below the body 3210.

A third buckling member 3213 may be arranged on each of two opposite ends of the body 3210. Configuration of the third buckling member 3213 may be identical with that of the third buckling member 3113 arranged on the first channel housing 311. The third buckling member 3213 may include a protrusion 3214 and a bump 3215, which will not be repeatedly described herein. The third buckling member 3113 arranged on the first channel housing 311 and the third buckling member 3213 arranged on the second channel housing 321 may be buckled to corresponding structures of the connector 33 to fix the two ends of the first channel housing 311 with the two ends of the second channel housing 321.

A first buckling member 3216 may be arranged on each of an outer side of the first convex edge 3211 away from the second convex edge 3212 and an outer side of the second convex edge 3212 away from the first convex edge 3211. The first buckling member 3216 may be a plurality of recesses evenly distributed for engaging with a plurality of first buckling members 3116, i.e., a plurality of protrusion. In this way, the first channel housing 311 may be buckled with the second channel housing 321 to cooperatively define a channel for the lacing assembly 20 to extend through.

A hook 3217 may be arranged on the first convex edge 3211 at a position corresponding to the recess 3118 defined in the first convex edge 3111 of the bottom front housing 31, and the hook 3217 may extend towards the bottom front housing 31 to buckle with a relevant element of the tightness adjustment mechanism 40. The corresponding recess 3118 defined in the bottom front housing 31 may avoid the hook 3217 and the relevant element of the tightness mechanism 40 while the hook 3217 is buckling with the relevant element of the tightness adjustment mechanism 40.

The second power housing 322 may include a second power housing body 3220, a side wall 3221, a partition board 3222, and a power supply bracket 324. The second power housing body 3220 may be recessed outwardly from a middle of the body 3210 of the second channel housing 321 and may extend downwardly. The side wall 3221 may extend from an edge of the second power supply housing body 3220, bending towards the bottom front housing 31. The partition board 3222 may be disposed inside the second power housing 322. The power supply bracket 324 may be disposed below the partition board 3222 and mounted inside the second power housing 322.

A length of the second power housing body 3220 may be the same as a length of the first power housing body 3120. A width of the second power housing body 3220 may substantially be a sum of a width of the first power housing body 3120 and a width of the body 3210 of the second channel housing 321.

A perforated tab 3220*a* may be arranged at a central portion of the second power housing body 3220 near an upper portion of the side wall 3221. Two isolation plates 3225 may be symmetrically disposed at two sides of the perforated tab 3220*a*. Each of the two isolation plates 3225 defines a notch 3226, and the notch 3226 is recessed away from the bottom front housing 31 to receive the relevant element of the tightness adjustment mechanism 40.

A perforation 3220*b* is further defined in the second power housing body 3220 to receive a power button 3220*c* (see FIG. 14 for details).

A second buckling member 3223 is arranged on a lower portion of the side wall 3221 below the second power housing 322 near an edge of the side wall 3221. The second buckling member 3223 may be a plurality of bumps spaced apart from each other. Positions of the plurality of bumps may correspond to positions of the second buckling members 3123 (such as the plurality of tabs) of the first power housing 312, such that the second buckling member 3123 of the first power housing 312 may be buckled with the second buckling member 3223 of the second power housing 322.

A buckling structure 3224 may be arranged on the side wall 3221 below the second power housing 322. The buckling structure 3224 may include two symmetrically disposed protrusions 3224*a* and a plurality of restriction plates 3224*b* disposed between the two protrusions 3224*a*. A width of each of the plurality of restriction plates 3224b may gradually change. Compared to each protrusion of the second buckling member 3223, the protrusions 3224a may be disposed further away from the outer edge of the side wall 3221 below the second power housing 322.

Figure 18:
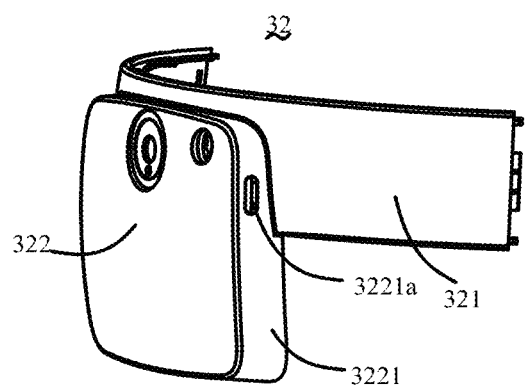
FIG. 18 is similar to FIG. 14, showing a perspective view of the bottom rear shell in FIG. 14 from another view angle.

As shown in FIG. 18, a side wall 3221 of the second power housing 322 adjacent to the second channel housing 321 may define a heat dissipation hole 3221a.

As shown in FIG. 17, two parallel positioning plates 3221b are arranged on the side wall 3221 below the second power housing 322, near the side wall 3221 on a left and a right of the second power housing 322.

The partition board 3222 separates a space of the second power housing 322 into two chambers. An upper chamber is defined for receiving the tightness adjustment mechanism 40 and allowing the lacing assembly 20, i.e., the first head band 21 and the second head band 22, to extend through. A lower chamber is defined for receiving the battery 35.

The partition board 3222 may be bent several times, obtaining two bending portions 3227 and a carrying portion 3228 connected to the two bending portions 3227.

The two bending portions 3227 may be disposed at two opposite sides of the carrying portion 3228 and away from a central portion of the partition board 3222. A top of each of the two bending portions 3227 may be higher than the carrying portion 3228. In this way, a space may be defined in a bottom of each of the two bending portions 3227 to receive the restriction plate 3124a of the first buckling structure 3124 of the bottom front housing 31 and to allow the restriction plate 3124a to contact the bottom of each of the two bending portions 3227.

A first buckling structure 3229 may be arranged on the carrying portion 3228 disposed between the two bending portions 3227, and may be disposed near the two bending portions 3227. The first buckling structure 3229 may be two protrusions. Positions of the two protrusions may correspond to positions of the two buckling plates 3124b of the first buckling structure 3124 of the first power housing 312, such that the two protrusions may be buckled to the two buckling plates 3124b. In this way, the first power housing 312 may be buckled to the partition plate 3222.

The carrying portion 3228 may define two openings 3228a, and each of the two openings is at a rear of the first buckling structure 3229 correspondingly, such that relevant structures of the power supply bracket 324 may be buckled with the two openings 3228a.

A carrying rib 3228b may be arranged at a central portion of the carrying portion 3228. The carrying rib 3228b may be disposed between the carrying portion 3228 and the second power housing body 3220, and may be perpendicular to the carrying portion 3228 and the second power housing body 3220. In this way, a strength of an attached surface between the carrying portion 3228 and the second power housing body 3220 may be improved, and the tightness adjustment assembly 40 may be supported by carrying rib 3228b.

Figure 19:
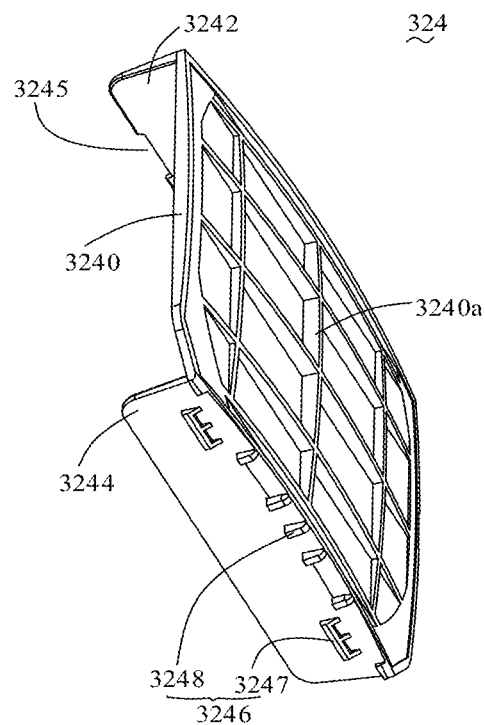
FIG. 19 is an enlarged perspective view of the battery support in FIG. 17.

As shown in FIG. 17 and FIG. 19, the power supply bracket 324 is received in the lower chamber defined in the second power housing 322. The power supply bracket 324 may have a bracket body 3240, a first mounting plate 3242 and a second mounting plate 3244. The bracket body 3240 may be mounted on the second power housing body 3210. The first mounting plate 3242 and the second mounting plate 3244 may extend from two opposite sides of the bracket body 3240.

Longitudinal and transverse reinforcement ribs 3240a may be arranged on a face of the bracket body 3240 facing the second power housing body 3210. A height of each reinforcement rib 3240a may gradually decrease from a center to two sides. In this way, after the bracket body 3240 contacts the curved second power housing body 3210, a face of the bracket body 3240 facing the bottom front housing 31 may be flat to carry a battery pad 3243 (as shown in FIG. 16). A length of the battery pad 3243 may be equal to a distance between the two positioning plates 3221b and may be equal to a length of the battery 35. The battery pad 3243 may be mounted on the bracket body 3240. Two ends of the battery pad 3243 may extend beyond the bracket body 3240 to abut against the two positioning plates 322b to carry the battery 35 stably.

The first mounting plate 3242 and the second mounting plate 3244 may be parallel to each other. The first mounting plate 3242 may be mounted on the partition plate 3222, and the second mounting plate 3244 may be mounted on the side wall 3221 below the second power housing 322.

A buckling portion 3245 may be arranged at an edge of the first mounting plate 3242 and at a position corresponding to the opening 3228a defined in the partition plate 3222. The buckling portion 3245 may be buckled into the opening 3228a, such that the first mounting plate 3242 is mounted to the partition plate 3222.

A buckling structure 3246 may be arranged on a face of the second mounting plate 3244 facing the side wall 3221 below the second power housing 322 and may be buckled to the buckling structure 3224 arranged on the side wall 3221. The buckling structure 3246 may include a protrusion 3247 and a restriction plate 3248. The protrusion 3247 may engage with the protrusion 3224a of the buckling structure 3224. The restriction plate 3248 may engage with the restriction plate 3224b of the buckling structure 3224.

The Connector 33 of the Second Housing Assembly 30

Figure 20:
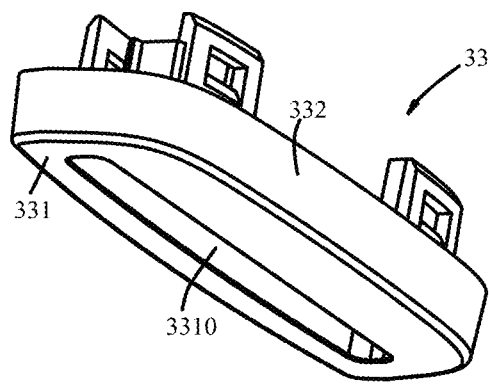
FIG. 20 is a perspective view of a connection member in FIG. 14.

As shown in FIG. 14 and FIG. 20, the connector 33 may include a connector body 331 and a side wall 332 extending from an edge of the connector body 331.

As shown in FIG. 14 and FIG. 20, the connector body 331 may substantially be rectangular, having rounded corners. The connector body 331 and four side walls 332 cooperatively define a housing cavity 333. The connector body 331 may define a through hole 3310 for the lacing assembly 20 to extend through. The connector body 331 is arranged with a buckling member 3313, and the buckling member 3313 may be received in the housing cavity 333. The buckling member 3313 may be buckled to the third buckling member 3113 of the first channel housing 311 and the third buckling member 3213 of the second channel housing 321. In detail, the buckling member 3313 may include a slot 3315 corresponding to the protrusion 3114 of the third buckling member 3113, another slot 3315 corresponding to the protrusion 3214 of the third buckling member 3213, a buckling tab 3314 corresponding to the bump 3115 of the third buckling member 3113, and another buckling tab 3314 corresponding to the bump 3215 of the third buckling member 3213.

When the bottom front housing 31 and the bottom rear housing 32 are buckled, the body 3110 of the first channel housing 311 and the body 3210 of the second channel housing 321 may cooperatively define the channel to receive the lacing assembly 20. When the first power housing 312 and the second power housing 322 are engaged, a space defined above the partition plate 3222 may be referred to as a first receiving cavity, and a space defined below the partition plate 3222 may be referred to as a second receiving cavity. The first receiving cavity may be communicated with the channel, serving as a first channel. In addition to receiving the first head band 21 and the second head band 22 overlapping with the first head band 21, the first receiving cavity may further receive the tightness adjustment mechanism 40 to adjust a length of an overlapping portion between the first head band 21 and the second head band 22. Therefore, a solid portion that defines the channel and the first receiving cavity may be referred to as a housing (may be referred to as a first housing) of the head band and the tightness adjustment mechanism. The second receiving cavity may be defined to receive the power supply, such as the battery 35, and may be referred to as a power supply housing (may be referred to as a second housing).

It shall be understood that, when the bottom front housing 31 and bottom rear housing 32 are engaged, the first power housing 312, the second power housing 322, and the body 3110 of the first channel housing 311 may be referred to as the first housing. A portion of the first channel housing 311 and the second channel housing 321 disposed on two sides of the first housing may be referred to as the second housing.

The above terms, such as the channel, the receiving cavity, the first receiving cavity, the second receiving cavity, the first housing, the second housing, the housing of the head band and the tightness adjustment mechanism, the power supply housing, may be adjusted according to actual situations. The present disclosure does not limit the above terms. According to actual situations, terms of similar structures may be interchangeable. For example, the channel may also be named as the first receiving cavity, and in this case, the previous first receiving cavity may be named as the second receiving cavity, and the previous second receiving cavity may be named as the third receiving cavity. Terms of the first housing and the second housing may also be interchanged.

The Tightness Adjustment Mechanism 40

Figure 21:
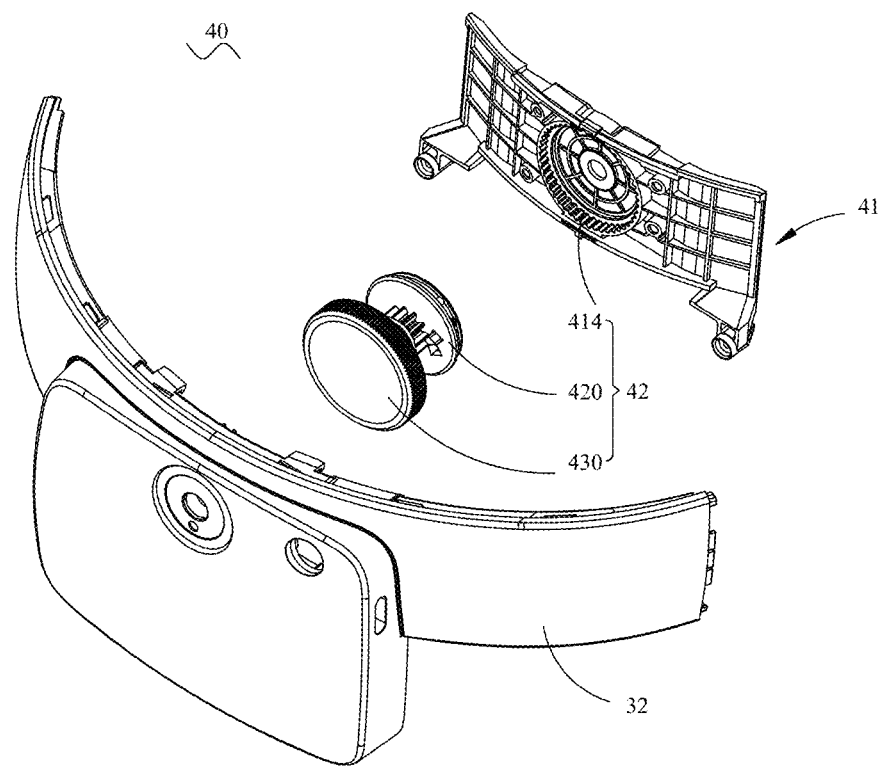
FIG. 21 is an explosive perspective view of a tightness adjustment mechanism.

As shown in FIG. 21, an exploded view of the tightness adjustment mechanism 40 according to an embodiment of the present disclosure is shown. The tightness adjustment mechanism 40 may include a first housing 41, a second housing engaging with the first housing 41 (in this case, the second housing may be the bottom rear housing 32 of the second housing assembly 30 described in the above. The bottom rear housing may be a shared element of the tightness adjustment mechanism 40 and the second housing assembly 30), and a ratchet pawl mechanism 42. The first housing 41 and the second housing may be engaged to form a cassette. A body portion of the ratchet pawl mechanism 42 may be received in the cassette. The two head bands (i.e., the first head band 21 and the second head band 22) of the lacing assembly 20 may be overlappingly connected to each other, further connecting to the ratchet pawl mechanism 42. The ratchet pawl mechanism 42 may adjust a length of the overlapping portion between the first head band 21 and the second head band 22. In this case, the second housing is not a necessary component. The ratchet pawl mechanism 42 may be mounted to the first housing 41 only, serving as the tightness adjustment mechanism 40.

The First Housing 41 of the Tightness Adjustment Mechanism 40

Figure 22:
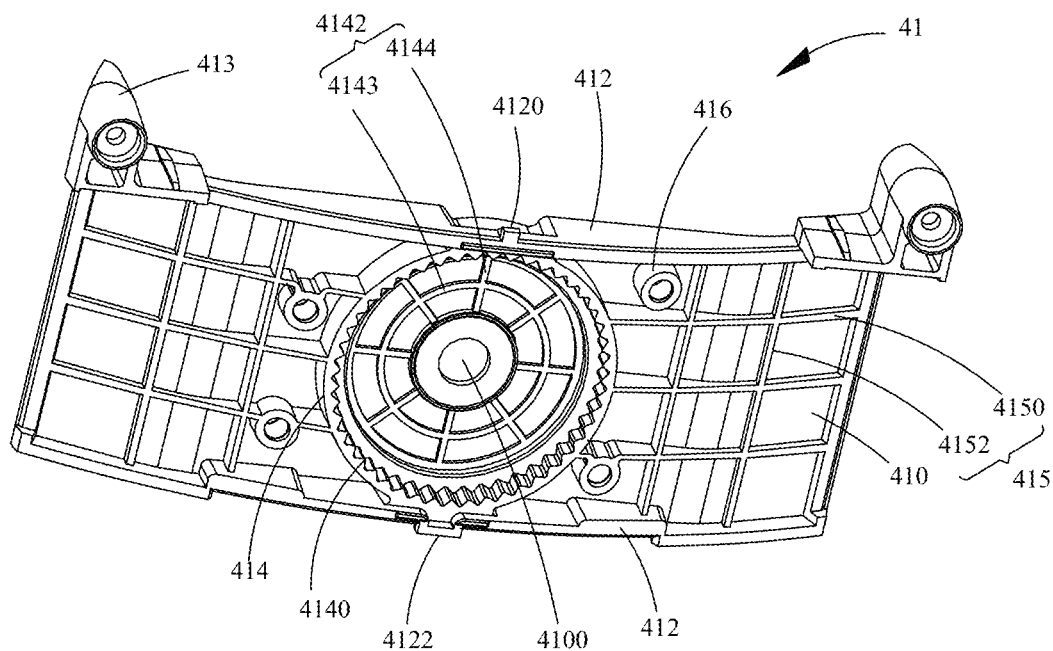
FIG. 22 is a perspective view of the first housing in FIG. 21.

As shown in FIG. 22, a perspective view of the first housing 41 from another view angle is shown. The first housing 41 may include a bottom plate 410. The bottom plate 410 may be a rectangular plate having a uniform thickness. A center of the bottom plate 410 may define a central hole 4100.

Two side plates 412 may be arranged on two opposite long sides of the bottom plate 410, extending towards the second housing (i.e., the bottom rear housing 32). A height of each of the two side plates 412 is gradually decreased from a middle to two sides, such that a surface of the side plate 412 facing the second housing is curved, enabling the side plate to tightly contact the second housing. A first mounting portion 413 may be arranged on each of two ends of one of the two side plates 412. The first mounting portion 413 may face the second housing and may be column shaped. The first mounting portion 413 may be arranged with internal threads, such that a bolt may be applied to extend through the first mounting portion 413 to fix the first housing 41 to the bottom rear housing 32.

The side plate 412 arranged with the first mounting portion 413 may further be arranged with a first buckling structure 4120 at a middle of the side plate 412. In one embodiment, the first buckling structure 4120 may include a recess and a protrusion disposed above the recess, such that the protrusion may be placed on the carrying rib 3228b to support the first housing 41 when the first housing 41 is fixed to the bottom rear housing 32. The other side plate 412 without the first mounting part 413 may be arranged with a second buckling structure 4122. In one embodiment, the second buckling structure 4122 may include three recesses spaced apart from each other and a protrusion disposed above a middle recess of the three recesses, such that each hook 3217 on the bottom rear housing 32 may be buckled with one of the three recesses. In this way, the first housing 41 is fixed to the bottom rear housing 32.

A ring-shaped ratchet 414, reinforcing ribs 415, and second mounting portions 416 may be arranged on a surface of the bottom plate 410 facing the second housing (i.e., the bottom rear housing 32). The reinforcing ribs 415 may be disposed around the ratchet 414. The second mounting portions 416 may be distributed at a periphery of the ratchet 414.

An inner wall of the ratchet 414 is arranged with internal teeth 4140. The central hole 4100 may be coaxial with the ratchet 414. A bottom of the ratchet 414 may be recessed away from the second housing and arranged with a rib 4142. The rib 4142 may include a plurality of circular first ribs 4143 and a plurality of strip-shaped second ribs 4144. The plurality of circular first ribs 4143 are coaxial with the central hole 4100. The plurality of strip-shaped second ribs 4144 intersect with the first ribs 4143 and extend from a center of the central hole 4100 towards various directions.

The reinforcement ribs 415 may include a plurality of first reinforcement ribs 4150 and a plurality of second reinforcement ribs 4152. The plurality of first reinforcement ribs 4150 may extend from an outer peripheral wall of the ratchet wheel 414 and may be parallel to each other. The plurality of second reinforcement ribs 4152 may intersect with the plurality of first reinforcement ribs 4150 and may be parallel to each other. The plurality of first reinforcement ribs 4150 extend from the outer peripheral wall of the ratchet 414 to edges of two relatively short sides of the bottom plate 410. A height of each of the plurality of first reinforcement ribs 4150 decreases from the outer peripheral wall of the ratchet 414 to the edges of the shorter sides of the bottom plate 410, such that an entire top surface of the plurality of first reinforcement ribs 4150 facing the second housing may be curved. In this way, when buckling with the bottom rear housing 32, the first head band 21 and the second head band 22 received in the cassette may fit with the first reinforcement ribs 4150, such that the first head band 21 and the second head band 22 may not be bent or folded. The second reinforcement ribs 4152 may be perpendicular to the first reinforcement ribs 4150, i.e. arranged to be perpendicular to the two relatively long sides of the bottom plate 410.

The Ratchet Pawl Mechanism 42 of the Tightness Adjustment Mechanism 40

As shown in FIG. 21, the ratchet pawl mechanism 42 may include the ratchet 414, a pawl assembly 420, and a knob assembly 430. The ratchet pawl mechanism 42 may be arranged on the first housing 41. The pawl assembly 420 may engage with the ratchet 414 and may be received in the ratchet 414. The knob assembly 430 may be mounted on and secured to the pawl assembly 420, may drive the pawl assembly 420 to rotate, and slidingly connected to the central hole 4100.

Figure 23:
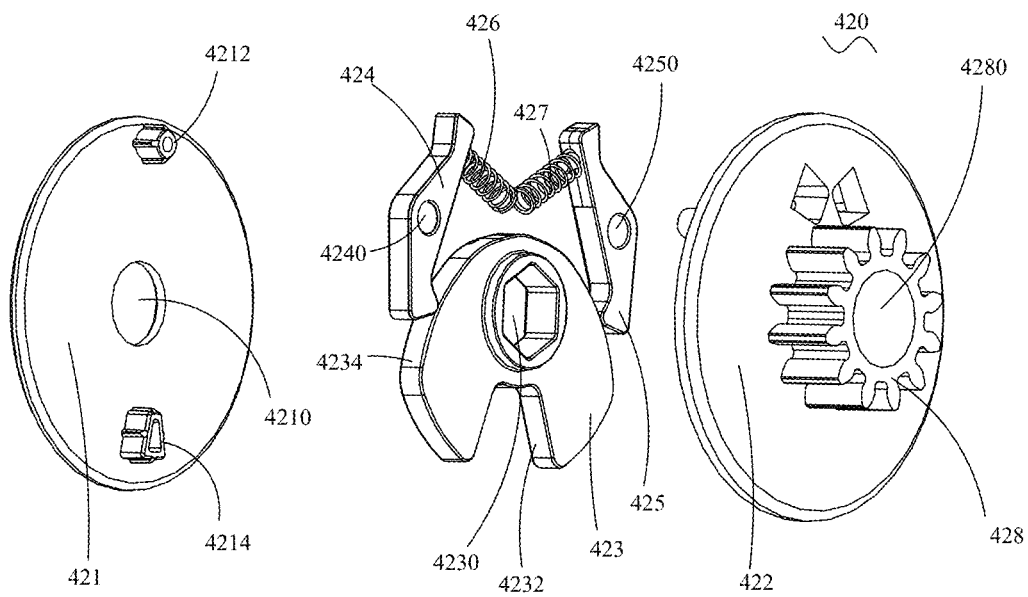
FIG. 23 is an explosive perspective view of a pawl assembly in FIG. 21.

As shown in FIG. 23, the pawl assembly 420 may include a first shielding plate 421, a second shielding plate 422, a rotating plate 423, a first pawl 424, a second pawl 425, a first spring 426, a second spring 427, and a gear 428. The second shielding plate 422 may be fixedly connected to the first shielding plate 421. The rotating plate 423 may be disposed between the first shielding plate 421 and the second shielding plate 422. The first pawl 424, the second pawl 425, the first spring 426 and the second spring 427 may be assembled on the second shielding plate 422. The gear 428 may be fixedly mounted on a side of the second shielding plate 422 away from the first shielding plate 421.

The first shielding plate 421 may be a circular plate and may define a central hole 4210 at a middle of the first shielding plate 421. The central hole 4210 may be aligned and coaxial with the central hole 4100 in the ratchet 414. A face of the first shielding plate 421 facing the second shielding plate 422 may be arranged with a first connection portion 4212 and a second connection portion 4214. The second connection portion 4214 may be column-prism shaped. The first connection portion 4212 may be cylindrical. A periphery of each of the first connection portion 4212 and the second connection portion 4214 may be arranged with stripped ribs to tightly engage with corresponding structures on the second shielding plate 422, such that the first shielding plate 421 may be fixedly connected to the second shielding plate 422.

Figure 24:
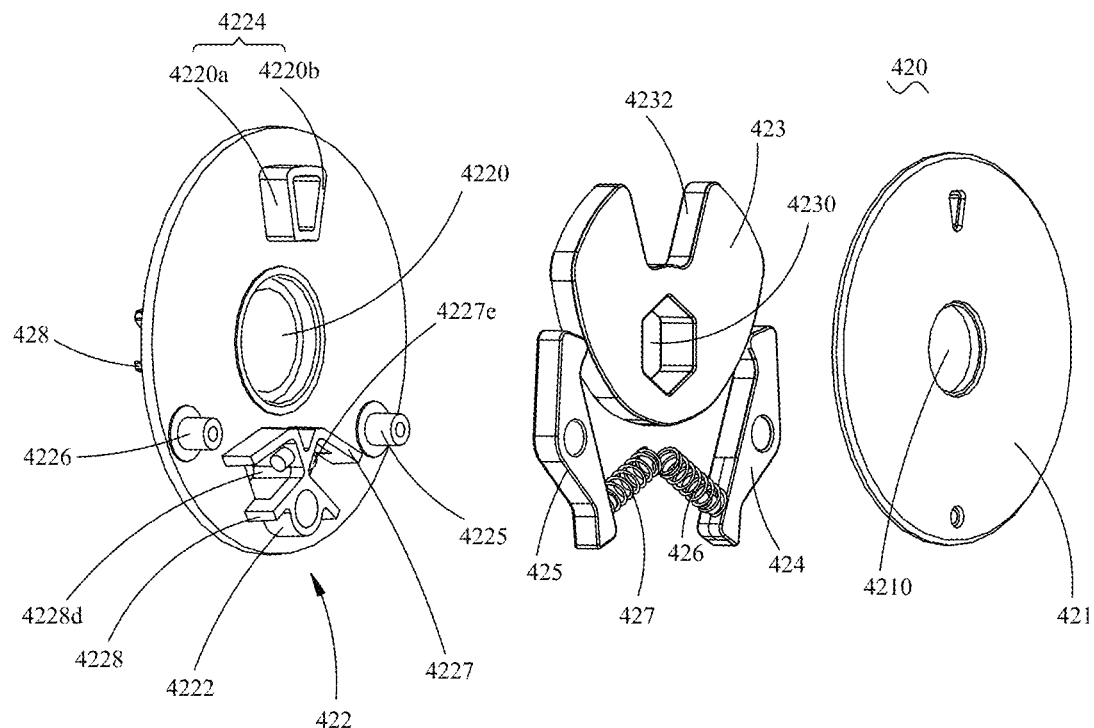
FIG. 24 is similar to FIG. 23, showing an explosive perspective view of the pawl assembly in FIG. 21 from another view angle.

As shown in FIG. 24, a shape and a size of the second shielding plate 422 may be substantially the same as a shape and a size of the first shielding plate 421. A middle portion of the second shielding plate 422 may define a central hole 4220. The central hole 4220 may be aligned with the central hole 4210 of the first shielding plate 421. A face of the second shielding plate 422 facing the first shielding plate 421 may be arranged with a first buckling portion 4222 and a second buckling portion 4224. A shape of the second buckling portion 4224 may be the same as a shape of the second connection portion 4214 of the first shielding plate 421, but a size of the second buckling portion 4224 may be the different from that of the second connection portion 4214 of the first shielding plate 421, such that the second connection portion 4214 of the first shielding plate 421 may be inserted into the second buckling portion 4224. The second buckling portion 4224 may include a first buckling wall 4220a and a second buckling wall 4220b arranged with a certain angle relative to the first buckling wall 4220a. That is, a distance between the first buckling wall 4220a and the second buckling wall 4220b may increase gradually in a direction from the central hole 4220 outwardly. A shape of the first bucking portion 4222 may be the same as a shape of the first connection portion 4212 of the first shielding plate 421, but a size of the first bucking portion 4222 may be the different from that of the first connection portion 4212 of the first shielding plate 421, such that the first connection portion 4212 of the first shielding plate 421 may be inserted into the first buckling portion 4222. The side of the second shielding plate 422 facing the first shielding plate 421 may further be arranged with a first mounting shaft 4225, a second mounting shaft 4226, a first mounting frame 4227, and a second mounting frame 4228. The first mounting shaft 4225 may be configured for mounting the first pawl 424. The second mounting shaft 4226 may be configured for mounting the second pawl 425. The first mounting frame 4227 may be configured for mounting the first spring 426. The second mounting frame 4228 may be configured for mounting the second spring 427.

The first shielding plate 421 and the second shielding plate 422 may also be used as a mounting member. The second buckling portion 4224 and the second connection portion 4214 may serve as a restriction portion to engage with the rotating plate 423, or serve as a fixing portion to fix the first shielding plate 421 with the second shielding plate 422. The first buckling portion 4222 and the first connection portion 4212 may serve as another fixing portion to fix the first shielding plate 421 with the second shielding plate 422.

The mounting member may not be limited to an assembly of the first shielding plate 421 and the second shielding plate 422. Any component that allows the first pawl 424 and the second pawl 425 to contact and engage with the ratchet 414 may be taken as the mounting member. That is, the mounting member may define a notch or any structure similar to the notch, enabling the first pawl 424 and the second pawl 425 to extend out of a space defined by the mounting member to contact the ratchet 414. Therefore, the mounting member may be a cassette having a notch or a structure similar to the notch.

Of course, the mounting member may be only the first shielding plate 421 or only the second shielding plate 422. For example, the mounting member is the second shielding plate 422, and the second buckling portion 4224 and the second connection portion 4214 may be formed on the first shielding plate 421 or on the second shielding plate 422, serving as the restriction portion.

The first mounting shaft 4225 and the second mounting shaft 4226 may be disposed on two sides of the first buckling portion 4222, respectively. The first mounting shaft 4225 and the second mounting shaft 4226 may be symmetrically arranged with respect to the first buckling portion 4222.

The first mounting frame 4227 and the second mounting frame 4228 may be disposed symmetrically with respect to the first buckling portion 4222. A shape, configuration, and a size of first mounting frame 4227 may be the same as those of the second mounting frame 4228.

Figure 25:
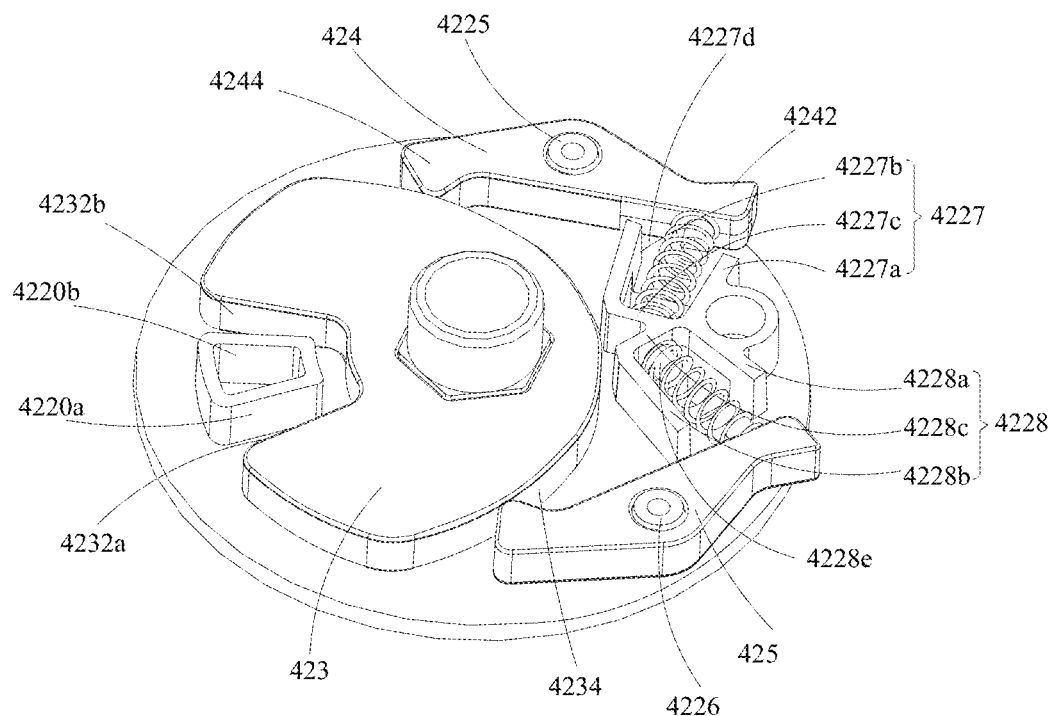
FIG. 25 is a perspective view of a portion of FIG. 24.

As shown in FIGS. 24 and 25, the first mounting frame 4227 may include a first retaining wall 4227a, a second retaining wall 4227b, and a connecting wall 4227c. The second retaining wall 4227b may be arranged at a certain angle relative to the first retaining wall 4227a. The connecting wall 4227c may connect an end of the first retaining wall 4227a to an end of the second retaining wall 4227b. The first retaining wall 4227a, the second retaining wall 4227b, and the connecting wall 4227c cooperatively define a receiving space 4227d to receive the first spring 426. The first retaining wall 4227a may extend from the outer peripheral wall of the first buckling portion 4222. A side of the connecting wall 4227c facing the receiving space 4227d may be arranged with a buckling shaft 4227e. The first spring 426 sleeves the buckling shaft 4227e.

Since the configuration of the second mounting frame 4228 may be the same as that of the first mounting frame 4227, the configuration of the second mounting frame 4228 may not be described in detail herein, and only elements are listed. The second mounting frame 4228 may include a first retaining wall 4228a, a second retaining wall 4228b, a connecting wall 4228c, a receiving space 4228d, and a buckling shaft 4228e. The first retaining wall 4227a of the first mounting frame 4227 is connected to the first retaining wall 4228a of the second mounting frame 4228, and an end of the connecting wall 4227c may be connected to an end of the connecting wall 4228c.

To be noted that the first spring 426 and the second spring 427 may also be other elastic members, such as tension springs, compression springs, objects providing extending and retracting forces, and so on. In this way, the first pawl 424 and the second pawl 425 may be engaged with the ratchet 414 to achieve switching between a buckled state and a non-buckled state. The corresponding first mounting frame 4227 and the second mounting frame 4228 may be replaced, depending on the elastic member, by other structures that can fix the elastic members The rotating plate 423 may be an eccentric wheel structure, having a through hole 4230. Of course, the rotating plate 423 and the knob assembly 430 may be an integral structure at the through hole 4230. The through hole 4230 may be aligned and coaxial with the central hole 4220 of the second shielding plate 422. In an embodiment, an inner surface of the through hole 4230 may be polygonal, such as hexagonal. An end of the rotating plate 423 away from the through hole 4230 may define a notch 4232. A shape of the notch 4232 may be the same as a shape of the first buckling portion 4222 of the second shielding plate 422, but a size of the notch 4232 may be the different from that of the first buckling portion 4222 of the second shielding plate 422. The size of the notch 4232 may be greater than the size of the first buckling portion 4222, such that the first buckling portion 4222 may be received in the notch 4232. In the present embodiment, the second buckling portion 4224 and the second connection portion 4214 serve as a restriction portion to engage in the notch 4232. The notch 4232 has two opposite inner walls, a first inner wall 4232a and a second inner wall 4232b opposite to the first inner wall 4232a. A circumferential surface of the rotating plate 423 includes an outer wall surface 4234. When the rotating plate 423 rotates around an axis of the through hole 4230, only three states exist between the rotating plate 423 and the second buckling portion 4224. In a first state, only the first inner wall 4232a contacts the first buckling wall 4220a. In a second state, the rotating plate 423 has no contact with the second buckling portion 4224. In a third state, only the second inner wall 4232b contacts the second buckling wall 4220b. That is, the restriction portion is configured to contact the inner wall of the notch 4232 or have no contact with the inner wall of the notch 4232, such that the rotating plate 423 rotates around a rotation axis (the axis of the through hole 4230) by a certain angle.

Figure 26:
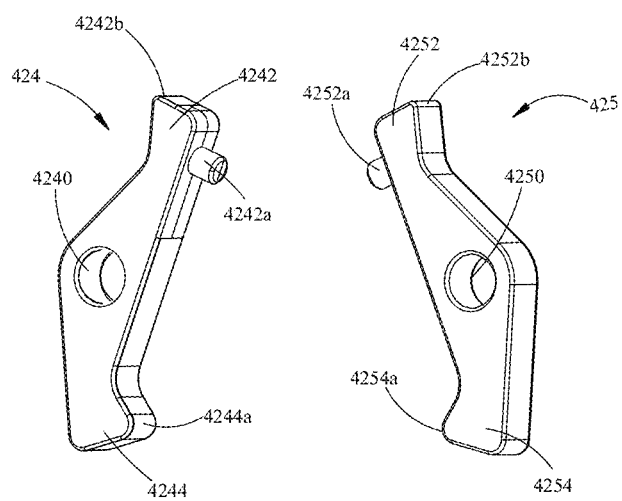
FIG. 26 is a perspective view of two pawls in FIG. 25.
Figure 27:
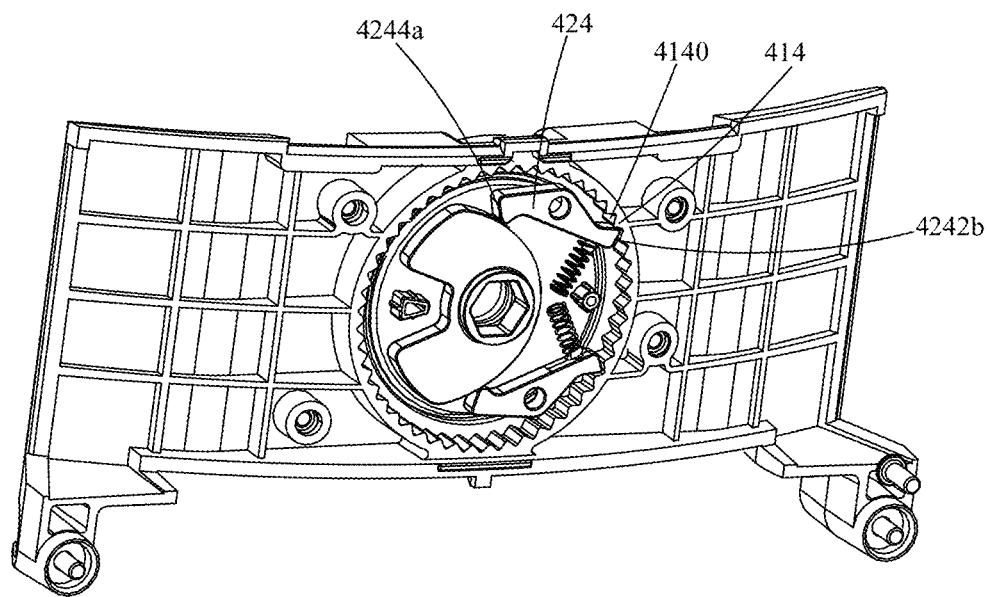
FIG. 27 is a perspective view of a portion of components of the pawl assembly and the first housing shown in FIG. 21.

As shown in FIGS. 24 to 26, the first pawl 424 may be pivotally mounted on and rotatable around the first mounting shaft 4225 arranged on the second shielding plate 422. A middle portion of the first pawl 424 may define a pivot hole 4240, such that the first mounting shaft 4225 may be pivotally received in the pivot hole 4240. The first pawl 424 has two opposite ends: a first end 4242 connected to the first spring 426 and a second end 4244 abutting against the outer wall surface 4234 of the rotating plate 423. A side of the first end 4242 facing the receiving space 4227d of the first mounting frame 4227 may be arranged with a mounting shaft 4242a, and the first spring 426 may sleeve the mounting shaft 4242a. A side of the first end 4242 away from the first mounting frame 4227 has a corner 4242b, and the corner 4242b may be configured to engage with the inner teeth 4140 of the ratchet 414 (see FIG. 27). A side of the second end 4244 facing the rotating plate 423 has a contact surface 4244a. In an embodiment, the contact surface 4244a may be curved, taking a line to contact the outer wall surface 4234 of the rotating plate 423, such that a pressure between the contact surface 4244a and the rotating plate 423 may be reduced.

The second pawl 425 and the first pawl 424 may be symmetrically disposed relative to the first buckling portion 4222. A shape and configuration of the second pawl 425 may be the same as those of the first pawl 424, and the present disclosure will not describe the second pawl 425 in detail, but will list components of the second pawl 425. The second pawl 425 may define a pivot hole 4250 and may include a first end 4252, a second end 4254, a mounting shaft 4252a, a corner 4252b, and a contact surface 4254a.

When mounting the first spring 426, an end of the first spring 426 may sleeve the buckling shaft 4227e in the first mounting frame 4227, and the other end of the first spring 426 may sleeve the mounting shaft 4242a of the first pawl 424. In this way, the first spring 426 may be mounted inside the first mounting frame 4227, and the first pawl 424 may rotate around the first mounting shaft 4225. When the first pawl 424 is rotating, the first pawl 424 may drive the first end 4242 of the first pawl 424 to move, pushing the first spring 426, such that the first spring 426 may be compressed in various extent in the first mounting frame 4227.

Configuration and functions of the second spring 427 may be the same as those of the first spring 426. The second spring 427 may be mounted in the second mounting frame 4228, and will not be repeatedly described here.

The outer wall surface 4234 of the rotating plate 423 may be curved. The outer wall surface 4234 may be configured as follows. When the rotating plate 423 rotates around the rotation axis, the outer wall surface 4234 may drive the first pawl 424 and the second pawl 425 to rotate, such that a state of the first pawl 424 and the second pawl 425 engaged with the ratchet 414 and a state of the first pawl 424 and the second pawl 425 unengaged with the ratchet 414 may be inter-switched. As shown in FIG. 25, no external force is applied to force the rotating plate 423 or the mounting member (combination of the first shielding plate 421 and the second shielding plate 422) to rotate. Due to actions of the first spring 426 and the second spring 427, when the rotating plate 423 does not contact the outer surface of the restriction portion (i.e., the outer surface of the second buckling portion 4224), the pawl assembly 420 may be buckled with the ratchet 414. When the external force is applied to drive the rotating plate 423 to rotate around the axis of the through hole 4230, two following states may occur.

State (1): the state of the rotating plate 423 having no contact with the second buckling portion 4224 may be switched into the state of only the first inner wall 4232a contacting the first buckling wall 4220a. In this case, in a direction of the rotating plate 423 rotating around the through hole 4230, a distance from a contact position between the first pawl 424 and the outer wall surface 4234 to the through hole 4230 may gradually increase, allowing the first end 4242 of the first pawl 424 to move and allowing the first end 4242 to be disengaged with the inner teeth 4140 of the inner wall of the ratchet 414. A distance from a contact position between the second pawl 425 and the outer wall surface 4234 to the through hole 4230 may gradually decrease, and the ratchet 414 compresses the second spring 427 of the second pawl 425, such that the second pawl 425 may be unbuckled with the inner teeth 4140 of the inner wall of the ratchet 414. Finally, the pawl assembly 420 is disengaged from the ratchet 414.

State (2): the state of the rotating plate 423 having no contact with the second buckling portion 4224 may be switched into the state of only the second inner wall 4232*b* contacting the second buckling wall 4220*b*. In this case, in the direction of the rotating plate 423 rotating around the through hole 4230, the distance from the contact position between the second pawl 425 and the outer wall surface 4234 to the through hole 4230 may gradually increase, such that the second end 4254 of the second pawl 425 may move, and the second end 4254 may be disengaged with the inner teeth 4140 of the inner wall of the ratchet 414. The distance from the contact position between the first pawl 424 and the outer wall surface 4234 to the through hole 4230 may gradually decrease, and the ratchet 414 may compress the first spring 426 of the first pawl 424, such that the first pawl 424 may be disengaged with the inner teeth 4140 of the inner wall of the ratchet 414. Finally, the pawl assembly 420 is disengaged from the ratchet 414.

As shown in FIG. 23, the gear 428 has a central hole 4280. The central hole 4280 may be aligned and coaxial with the central hole 4220 of the second shielding plate 422. The gear 428 may be fixed on a side of the second shielding plate 422 away from the first shielding plate 421.

Figure 28:
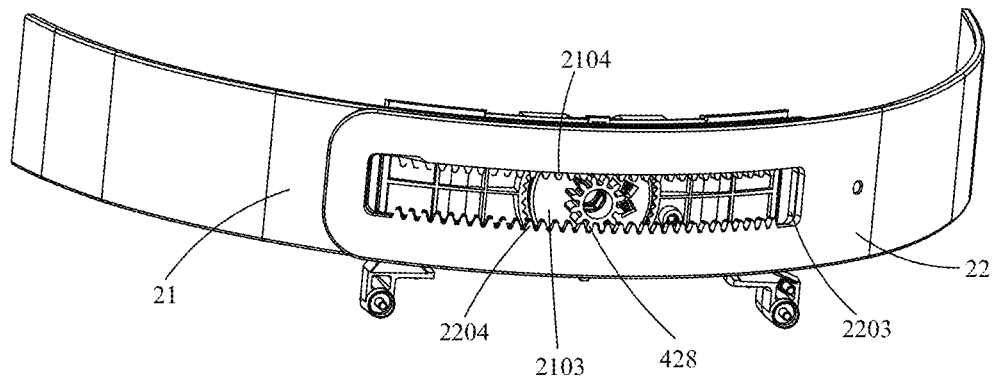
FIG. 28 is a perspective view of the lacing assembly and a portion of the tightness adjustment mechanism.

As shown in FIG. 28, when the lacing assembly 20 is connected to the tightness adjustment mechanism 40, the end of the first head band 21 that defines the length adjustment hole 2103 may overlap with the end of the second head band 22 that defines the length adjustment hole 2203. In this case, the first sawtooth wave 2104 and the second sawtooth wave 2204 may be received in the two overlapped length adjustment holes 2103 and 2203, and may be disposed on two opposite sides of the overlapped length adjustment holes. The gear 428 may be received in the two overlapped length adjustment holes 2103 and 2203, and may engage with the first sawtooth wave 2104 and the second sawtooth wave 2204.

Figure 29:
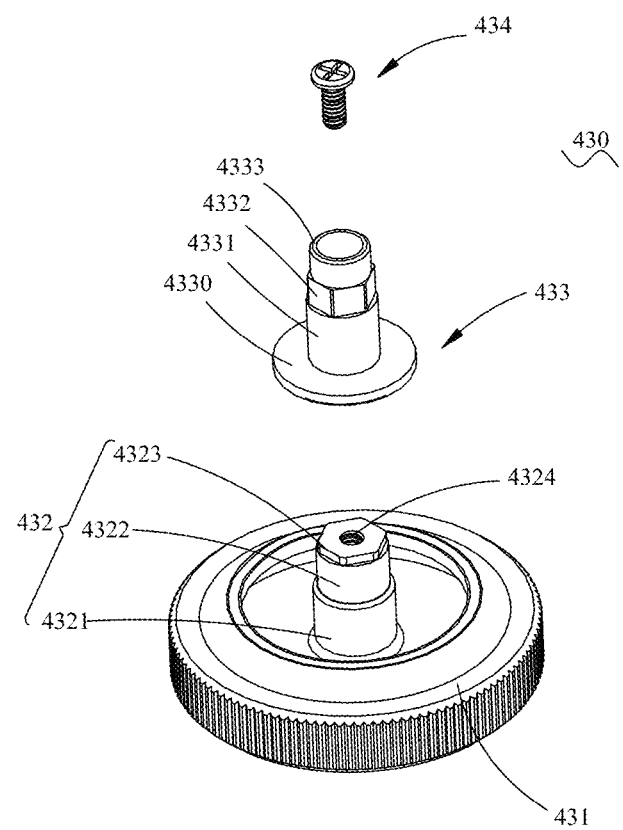
FIG. 29 is an explosive perspective view of a knob assembly in FIG. 21.
Figure 30:
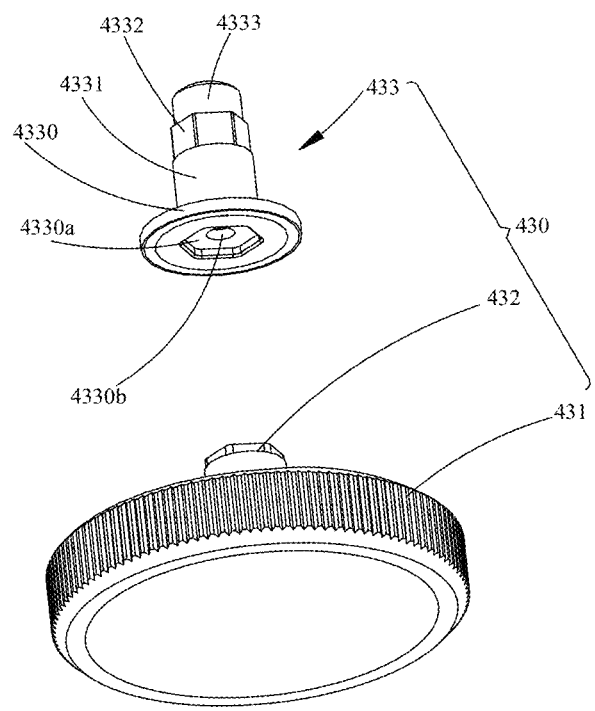
FIG. 30 is similar to FIG. 29, showing an explosive perspective view of the knob assembly in FIG. 21 from another view angle.

As shown in FIG. 29 and FIG. 30, the knob assembly 430 may include a rotating disk 431, a first drive shaft 432, and a second drive shaft 433. The first drive shaft 432 may extend from an inner surface of the rotating disk 431. The second drive shaft 433 may be mounted on the first drive shaft 432.

A side surface of the rotating disk 431 may be rough. In an embodiment, the outer surface of the rotating disk 431 may define a plurality of recesses. The plurality of recesses may be parallel to each other, and a convex rib may be formed between two adjacent recesses.

The first drive shaft 432 and the second shielding plate 422 may have a same central axis. The first rotation shaft 432 may include a first connection shaft 4321, a second connection shaft 4322 and a third connection shaft 4323. The first connection shaft 4321, the second connection shaft 4322, and the third connection shaft 4323 may be coaxial and may be arranged in sequence along a direction approaching the central axis of the second shielding plate 422. Each of the first connection shaft 4321 and the second connection shaft 4322 may be a circular shaft, that is, an outer circumferential surface of the shaft may be circular. An outer diameter of the first connection shaft 4321 may be greater than an outer diameter of the second connection shaft 4322. An outer circumferential surface of the third connection shaft 4323 may be polygonal. In an embodiment, the outer circumferential surface of the third connection shaft 4323 may be hexagonal. A distance between a center of the hexagon and any one of six sides of the hexagonal may be less than a radius of the second connection shaft 4322. A center of the third connection shaft 4323 may define a central hole 4324, and internal threads may be arranged on a wall of the central hole 4324

The second drive shaft 433 and the first drive shaft 432 may have a same central axis. The second drive shaft 433 includes a disk 4330, a first connection shaft 4331, a second connection shaft 4332, and a third connection shaft 4333. The disk 4330, the first connection shaft 4331, the second connection shaft 4332, and the third connection shaft 4333 may be coaxial and may be arranged in sequence along a direction away from the axis of the rotating disk 431. The first connection shaft 4331 may be connected to the disk 4330. The second connection shaft 4332 may be connected to the first connecting shaft 4331. The third connection shaft 4333 may be connected to the second connecting shaft 4332.

An outer diameter of the disk 4330 may be greater than an outer diameter of the first connection shaft 4331 and greater than an outer diameter of the gear 428. A bottom of the disk 4330 may define a recess 4330*a*. A middle portion of a bottom wall of the recess 4330*a* may define a through hole 4330*b*. An inner wall of the recess 4330*a* may be polygonal. In an embodiment, the inner wall of the recess 4330*a* may be hexagonal, such that the third connection shaft 4323 of the first drive shaft 432 may be engaged into the recess 4330*a*. When the gear 428 is received in the second length adjustment holes 2103 and 2203 of the overlapped portion of the first head band 21 and the second head band 22, the disk 4330 may engage with the gear 428 and the second shielding plate 422 to restrict positions of the first head band 21 and the second head band 22, preventing the first head band 21 and the second head band 22 from being disengaged with the gear 428.

Each of the first connection shaft 4331 and the third connection shaft 4333 may be a circular shaft, that is, an outer circumferential surface may be circular. An outer diameter of the first connection shaft 4331 may be greater than an outer diameter of the third connection shaft 4333. The outer circumferential surface of the second connection shaft 4332 may be polygonal. In an embodiment, outer circumferential surface of the second connection shaft 4332 may be hexagonal. A distance between a center of the hexagon and any one of six sides of the hexagonal may be less than a radius of the first connection shaft 4331 and greater than a radius of the third connection shaft 4333. A shape and dimensions of the second connection shaft 4332 may match with a shape and dimensions of the through hole 4230 of the rotating plate 423, such that the rotating plate 423 may be fixedly connected to the second connection shaft 4332.

When assembling the lacing assembly 20, the second housing assembly 30, and the tightness adjustment mechanism 40, the lacing assembly 20 may be firstly assembled. Each of the first head band 21 and the second head band 22 of the lacing assembly 20 may extend through the through hole 3310 of one connector 33. At the same time, the first drive shaft 432 of the rotating disk 431 may extend through the perforated tab 3220*a* from a rear of the bottom rear housing 32. Subsequently, the disk 4330 may be mounted on the third connection shaft 4323. In this way, the second drive shaft 433 may be engaged with the first drive shaft 432. A screw 434 may extend through the through hole 4330*b* in the bottom of the disk 4330 and threadedly connect to the center hole 4324 of the third connection shaft 4323 of the first drive shaft 432, such that the second drive shaft 433 may be stably connected to the first drive shaft 432.

A portion of the first head band 21 that defines the length adjustment hole 2103 may overlap with a portion of the second head band 22 that defines the length adjustment hole 2203. The gear 428 may be placed inside the length adjustment hole 2103 and the length adjustment hole 2203. The second drive shaft 433 may extend through the gear 428, the central hole 4210 and the central hole 4220 of the second shielding plate 422. The first pawl 424, the second pawl 425, the first spring 426, the second spring 427, and the rotating plate 423 may be mounted on the second shielding plate 422. For example, the third connection shaft 4333 of second drive shaft 433 may extend through the rotating plate 423, allowing the rotating plate 423 to sleeve the second connection shaft 4332. In this way, the rotating plate 423 may be fixedly arranged relative to the first rotation shaft 432 and the second rotation shaft 433, and at the same time, the second buckling portion 4224 on second shielding plate 422 may be received in the notch 4232 of the rotating plate 423. The second end 4242 of the first pawl 424 and the second end 4252 of the second pawl 425 may contact the outer wall surface 4234 of the rotating plate 423.

Figure 31:
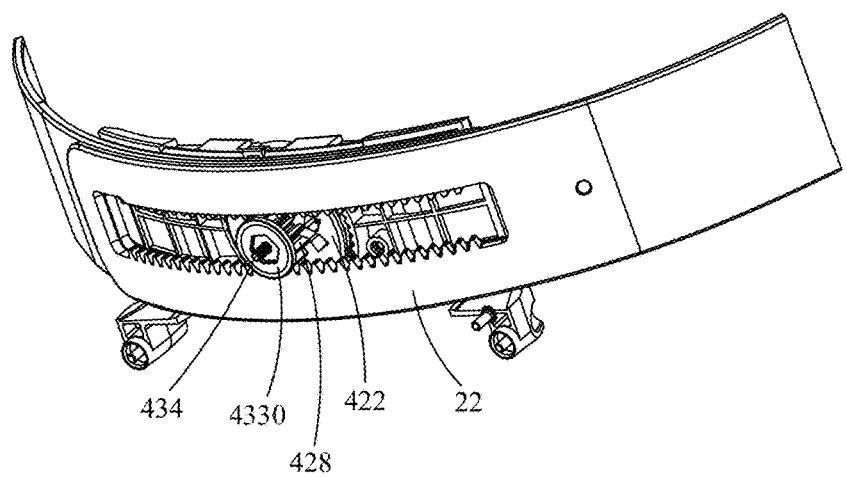
FIG. 31 is similar to FIG. 28, showing a perspective view of the lacing assembly and a portion of the tightness adjustment mechanism.

The first shielding plate 421 may be buckled to the second shielding plate 422. The first connection part 4212 of the first shielding plate 421 may be buckled with the first buckling portion 4222 of the second shielding plate 422. In this way, the first shielding plate 421 may be assembled with the second drive shaft 433, and at the same time, the first shielding plate 421 may be fixed relative to the second shielding plate 422. That is, the first shielding plate 421 and the second shielding plate 422 may simultaneously radially rotate relative to the second drive shaft 433. The first pawl 424, the second pawl 425, the first spring 426, the second spring 427 and the rotating plate 423 may be fixed between the first shielding plate 421 and the second shielding plate 422. The pawl assembly 420 may be received in the ratchet 414, and the third connection shaft 4333 of the second drive shaft 433 may extend into and engaged with the central hole 4100 of the ratchet 414. The first housing 41 may be buckled with the bottom rear housing 32. At this time, the bottom of the gear 428 may abut against the disk 4330. The disk 4330 may compress and limit positions of the first head band 21 and the second head band 22 (as shown in FIG. 31). The bump of the first buckling structure 4120 may be placed on the carrying rib 3228b to support the first housing 41. The second buckling structure 4122 may be buckled with and fixed to the hook 3217 on the bottom rear housing 32, and a screw is taken to fix the first mounting portion 413 to the bottom rear housing 32. In this way, the first head band 21 and the second head band 22 may be fixedly arranged inside the tightness adjustment mechanism 40. Assembly of the lacing assembly 20 and the tightness adjustment mechanism 40 may be completed.

The buckling portion 3245 of the power supply bracket 324 may be buckled to a corresponding opening 3228a of the carrying portion 3228. The buckling structure 3246 of the power supply bracket 324 may be buckled to a corresponding buckling structure 3224 on the side wall 3221. The battery pad 3243 may be disposed on the power supply bracket 324 for the battery 35 to be placed. The bottom front housing 31 and the bottom rear housing 32 may be assembled. The first buckling member 3216 on the bottom rear housing 32 may be buckled to a corresponding first buckling member 3116 on the first channel housing 311. The second buckling member 3223 on the bottom rear housing 32 may be buckled to a corresponding second buckling member 3123 on the convex edge 3121. Subsequently, two connectors 33 may be mounted. The buckling member 3313 of the connector 33 may be buckled to the third buckling member 3113 of the bottom front housing 31 and the third buckling member 3213 of the bottom rear housing 32. In this way, the bottom front housing 31 and bottom rear housing 32 may be fixed. Assembly of the lacing assembly 20 with the second housing assembly 30 and the tightness adjustment mechanism 40 may be completed.

While adjusting the lacing assembly 20, as shown in FIG. 25, in an initial state, the first spring 426 raises the first pawl 424, such that the first end 4242 may be buckled with the inner teeth 4140 of the ratchet 414; and the second spring 427 raises the second pawl 425, such that the first end 4252 may be buckled with the inner teeth 4140 of the ratchet 414. At this moment, the first pawl 424 and the second pawl 425 may contact the rotating plate 423, such that the rotating plate 423 does not contact the second buckling portion 4224. The lacing assembly 20 may apply a force on the mounting member, such that when the mounting member rotates in either direction, one pawl may be buckled with the inner teeth 4140 of the ratchet 414. In this way, the restriction portion of the mounting member cannot directly contact the rotating plate 423, forcing the first shielding plate 421 to be unable to perform rotation, such that the head band assembly 20 may be buckled, preventing the lacing assembly 20 from being loose.

When taking the knob assembly 430 to adjust the length of the lacing assembly 20, the knob assembly 430 drives the rotating plate 423 to rotate, such that the state of no contact between the rotating plate 423 and the second buckling portion 4224 may be switched to the state of only the first inner wall 4232a contacting the first buckling wall 4220a or to the state of only the second inner wall 4232b contacting the second buckling wall 4220b. In either state, the pawl assembly 420 may be disengage from the ratchet 414, driving the first shielding plate 421 to rotate, and tightness of the lacing assembly 20 may be adjusted by the gear 428.

It shall be understood that the first housing 41 may also be the bottom front housing 31 of the second housing assembly 30. The ratchet 414 may be formed on the body 3110, and the central hole 4100 may be defined in the body 3110. The ratchet pawl mechanism 42 may engage with the ratchet 414. In addition, when the first head band 21 and the second head band 22 are overlappingly connected to the tightness adjustment mechanism 40, and when the tightness adjustment mechanism 40 adjusts the length of the overlapped portion of the first head band 21 and the second head band 22, a distance from the first head band 21 and the second head band 22 to the tightness adjustment mechanism 40 and a distance from the first head band 21 and the second head band 22 to the housing of the head band and the tightness adjustment mechanism may be adjusted accordingly. In the present disclosure, the bottom front housing 31 and the bottom rear housing 32 may serve as a housing of the tightness adjustment mechanism, serving as a portion of the tightness adjustment mechanism. Of course, the first housing 41 and the bottom rear housing 32 serve as the housing of the tightness adjustment mechanism.

The Force Bearing Assembly 50

As shown in FIG. 1, a perspective view of a head-mounted device 100 according to an embodiment of the present disclosure is shown. The force bearing assembly 50 may include a first force bearing member 51 and a second force bearing member 52. The first force bearing member 51 may be arranged on the first housing assembly 10. The second force bearing member 52 may be arranged on the second housing assembly 30. In the present embodiment, the first housing assembly 10, the lacing assembly 20, the second housing assembly 30, and the tightness adjustment mechanism 40 may serve as a ring-shaped frame, and tightness of the frame may be adjustable. Further, the first force bearing member 51 may be disposed on one side of the ring-shaped frame, and the second force bearing member 52 may be disposed on another side of the ring-shaped frame. For example, the first force bearing member 51 may be disposed on an upper side of the first housing assembly 10 and the second housing assembly 30, and the second force bearing member 52 may be disposed on a lower side of the first housing assembly 10 and the second housing assembly 30. The first force bearing member 51 may be inclined to a side near the second force bearing member 52. In addition, the first force bearing member 51 may be a first force bearing point, the first housing assembly 10 may be a second force bearing point, and the second force bearing member 52 may be a third force bearing point. The head-mounted device 100 may be stably supported and worn to the user by the first bearing point, the second bearing point and the third force bearing point.

It shall be understood that each of the "first force bearing member" and the "second force bearing member" may also be referred to as a "force bearing member".

The First Force Bearing Member 51 of the Force Bearing Assembly 50

As shown in FIG. 2, the first force bearing member 51 may include a support plate 511, a mounting plate 512, a neck portion 513, and a soft pad 514. The mounting plate 512 may be arranged with a certain angle relative to the support plate 511 and mounted on the first housing assembly 10. The neck portion 513 may be disposed between and connected to the support plate 511 and the mounting plate 512. The soft pad 514 may be arranged on the support plate 511.

The Second Force Bearing Member 52 of the Force Bearing Assembly 50

Figure 32:
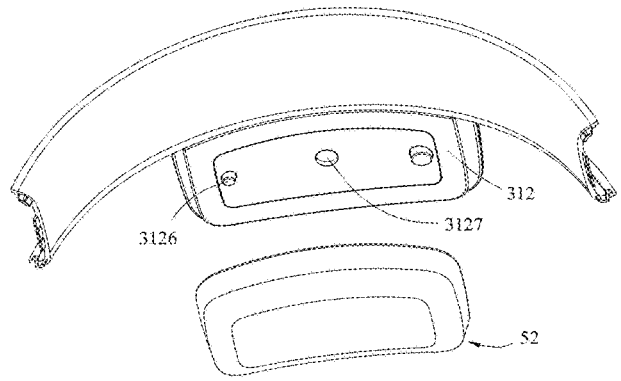
FIG. 32 is an explosive perspective view of a second force bearing member of a force bearing assembly and a bottom front shell of the second housing assembly shown in FIG. 1.
Figure 33:
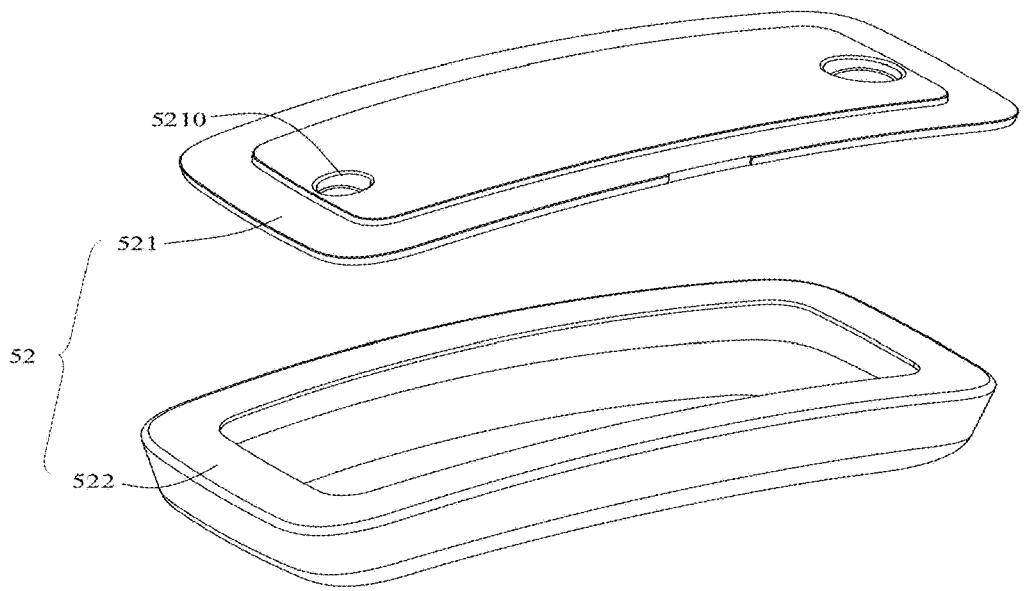
FIG. 33 is an explosive perspective view of a second force bearing member shown in FIG. 32.

As shown in FIG. 32, an exploded view of the second force bearing member 52 of the force bearing assembly 50 and the bottom front housing 31 of the second housing assembly 30 according to an embodiment is shown. The second force bearing member 52 may be fixedly mounted on the bottom front housing 31 of the second housing assembly 30. As shown in FIG. 33, an exploded view and a perspective view of the second force bearing member 52 according to an embodiment are shown. The second force bearing member 52 may include a fixing plate 521 and a soft pad 522 covering the fixing plate 521.

A shape and a size of the fixing plate 521 may match with a shape and a size of the first power housing body 3120 of the bottom front housing 31 of the second housing assembly 30. The fixing plate 521 may define a mounting hole 5210 corresponding to the connection member 3126 of the first power housing body 3120.

While mounting the second force bearing member 52 on the second housing assembly 30, the soft pad 522 may sleeve the fixing plate 521, and the fixing plate 521 may be aligned to the connection member 3126 on the first power housing body 3120, allowing the connection member 3126 to be firmly inserted in the mounting hole 5210, such that the second force bearing member 52 may be stably mounted on the second housing assembly 30. Alternatively, positions of the connection member 3126 and the mounting hole 5210 may be interchangeable. That is, the mounting hole 5210 may be defined in the second housing assembly 30, and the connection member 3126 may be arranged on the second force bearing member 52. Of course, the present disclosure does not limit a form of the mounting hole 5210 and the connection member 3126. Any means that allows the second force bearing member 52 to be mounted on the second housing assembly 30 may be applied, such as glue adhesion.

When the user puts on the head-mounted device 100, since the lacing assembly 20 connects the first housing assembly 10 and the second housing assembly 30 together, forming a wearable ring-shaped frame and enabling the second force bearing member 52 and the first housing assembly 10 to be a main force bearing point, the first housing assembly 10 may contact a forehead of the user and the second force bearing member 52 may contact a rear of the user's head. The user takes the forehead and the rear of the head to support the head-mounted device 100. Since the first force bearing member 51 is disposed at an upper of the forehead and is inclined towards the second force bearing member 52, and contacts the upper of the forehead, the head-mounted device 100 may be firmly supported. Therefore, it may be comfortable for the user to wear the head-mounted device.

The above description shows preferred embodiments of the present disclosure. To be noted that, for an ordinary skilled person in the art, various improvements and embellishments may be made without departing from the principles of the present disclosure, and the various improvements and embellishments shall be within the scope of the present disclosure.

What is claimed is:

1. A head-mounted device, comprising:
a first housing, comprising a first receiving cavity and a second receiving cavity separated from each other;
two second housings, respectively extending from two opposite sides of the first housing, and the two second housings having two third receiving cavities, the two third receiving cavities being communicated with the first receiving cavity and respectively located on the left and right sides of the first receiving cavity; wherein a part of the first housing having the second receiving cavity extends beyond the second housing;
a lacing assembly, comprising a first head band and a second head band, one end of the first head band and one end of the second head band are overlapped and connected in the first receiving cavity and the third receiving cavity to form an overlapping portion, and the other ends of the first head band and the second head band are exposed outside the first receiving cavity; and
a tightness adjustment mechanism, comprising:
a ratchet pawl mechanism, accommodated in the first receiving cavity, and the tightness adjustment mechanism is matched with the overlapping portion through the ratchet pawl mechanism to adjust a length of the overlapping portion.

2. The head-mounted device according to claim 1, wherein the tightness adjustment mechanism further comprises:
a knob assembly, matched with the ratchet pawl mechanism to adjust the length of the overlapping portion.

3. The head-mounted device according to claim 2, wherein the ratchet pawl mechanism comprises:
a ratchet in a circular ring shape, wherein an inner side of the ratchet is provided with inner teeth, the ratchet is formed on the first housing in the first receiving cavity; and
a pawl assembly matched with the ratchet to adjust the length of the overlapping portion;
wherein the knob assembly is matched with the pawl assembly and the ratchet.

4. The head-mounted device according to claim 3, wherein the pawl assembly comprises:
a mounting portion;

a rotating plate installed on the mounting portion, wherein the rotating plate is matched with the knob assembly and rotated relative to the mounting portion;

a pawl pivoted at the mounting portion, wherein one end of the pawl is in contact with the rotating plate, and the other end of the pawl is matched with the ratchet; and a gear installed on the mounting portion, wherein the gear is driven to rotate by the rotating plate to adjust the overlapping length of the first head band and the second head band.

5. The head-mounted device according to claim 4, wherein both of the first head band and the second head band are provided with a length adjustment hole at the overlapping portion, the length adjustment hole is a strip-shaped through hole, and each of the first head band and the second head band is provided with sawtooth wave extending along the length direction of the strip-shaped through hole in the length adjustment hole, the gear is disposed in the length adjustment hole and meshed with the sawtooth wave of each of the first head band and second head band, to adjust the overlapping length of the first head band and second head band.

6. The head-mounted device according to claim 4, wherein the mounting portion comprises two shielding plates disposed opposite and fixedly mounted, and the rotating plate is disposed between the two shielding plates; the pawl is pivoted on the shielding plate.

7. The head-mounted device according to claim 6, wherein the pawl assembly further comprises:

an elastic member; wherein one end of the elastic member is contacted with the shielding plate, and the other end of the elastic member is contacted with the end of the pawl matched with the ratchet; the pawl and the ratchet switch between engagement and unengagement by the match of the elastic member and the rotating plate.

8. The head-mounted device according to claim 7, wherein the pawl comprises a corner at a side away from the elastic member, and the corner is configured to engage with the inner teeth of the ratchet.

9. The head-mounted device according to claim 7, wherein the two shielding plates are provided with a restriction portion on the rotation path of the rotating plate, the rotating plate is provided with a notch matched with the restriction portion, and the restriction portion is located in the notch, the restriction portion is configured in two states of contact and non-contact with the inner wall of the notch, so that the rotating plate is rotated by a fixed angle around a rotation axis of the rotating plate.

10. The head-mounted device according to claim 9, wherein the rotating plate has an outer wall surface, the outer wall surface is curved and configured to: when the rotating plate rotates around the rotation axis, the outer wall surface pushes the pawl to rotate, so that the pawl and the ratchet switch between the engagement and unengagement.

11. The head-mounted device according to claim 10, wherein the number of pawls is two, and the two pawls are symmetrically disposed relative to the two sides of the rotating plate.

12. The head-mounted device according to claim 7, wherein the gear is fixedly mounted on one of the two shielding plates, and the axis of gear is coaxial with the rotation axis of the rotating plate.

13. The head-mounted device according to claim 6, wherein the middle of the pawl is rotationally connected with a mounting shaft, one end of the mounting shaft is fixedly mounted on one of the two shielding plates, and the other end of the mounting shaft contacts with the other of the two shielding plates.

14. The head-mounted device according to claim 6, wherein the knob assembly comprises:

a rotating disk exposed out of the first receiving cavity;
a first drive shaft extended from the inner surface of the rotating disk, the first drive shaft being rotatably connected with the first housing; and
a second drive shaft, one end of the second drive shaft is coaxially installed with the first drive shaft, the middle of the second drive shaft is rotatably connected with the two shielding plate and fixed with the rotating plate, and the other end of the second drive shaft is rotatably connected with the first housing.

15. The head-mounted device according to claim 14, wherein the second drive shaft comprises:

a disk, aligned and coaxial with the first drive shaft, and the side of the disk is in contact with the gear;
a first connecting shaft, aligned and coaxially fixed with the disk, and connected with one of the two shielding plates which the gear is mounted on;
a second connecting shaft, aligned and coaxially fixed with the first connecting shaft, and movably connected the drive shaft of the rotating plate; and
a third connecting shaft, aligned and coaxially fixed with the second connecting shaft, and rotatably connected with one of the two shielding plates without the gear, and rotatably connected with the first housing.

16. The head-mounted device according to claim 15, wherein the outer diameter of the disk is larger than the outer diameter of the first connecting shaft, and the radius of the disk is larger than the radius of the gear.

17. A head-mounted device, comprising:
a host housing;
a first housing, disposed opposite to the host housing, and having a first receiving cavity;
a second housing, extending from a side of the first housing, and having a second receiving cavities which is spaced apart from the first receiving cavity; wherein the extending length of the first housing is greater than the extending length of the second housing in the same direction;
a lacing assembly, comprising a first head band and a second head band, one end of the first head band and one end of the second head band are overlapped and connected in the first receiving cavity to form an overlapping portion, and the other ends of the first head band and the second head band are extended out of the first receiving cavity and connected with the host housing;
a ratchet pawl mechanism, accommodated in the first receiving cavity, and matched with the overlapping portion to adjust the length of the overlapping portion, wherein the ratchet pawl mechanism is supported by a bottom wall of the first housing, the bottom wall comprises two opposite surfaces, the second housing is disposed on one of the two opposite surfaces of the bottom wall, and the ratchet pawl mechanism is disposed on the other of the two opposite surfaces of the bottom wall; and
a knob assembly, matched with the ratchet pawl mechanism to adjust the length of the overlapping portion.

18. A head-mounted device, comprising:
a host housing;
a first housing, disposed opposite to the host housing, and having a first receiving cavity;

a second housing, extending from a side of the first housing, and having a second receiving cavities which is spaced apart from the first receiving cavity; wherein the extending length of the first housing is greater than the extending length of the second housing in the same direction;

a lacing assembly, forming a ring-shaped frame with the host housing and the first housing, wherein the lacing assembly comprises a first head band and a second head band, one end of the first head band and one end of the second head band are overlapped and connected in the first receiving cavity to form an overlapping portion, and the other ends of the first head band and the second head band are extended out of the first receiving cavity and connected with the host housing;

a ratchet pawl mechanism, accommodated in the first receiving cavity, and matched with the overlapping portion to adjust the length of the overlapping portion, wherein the ratchet pawl mechanism is supported by a bottom wall of the first housing, the bottom wall comprises two opposite surfaces, the second housing is disposed on one of the two opposite surfaces of the bottom wall, and the ratchet pawl mechanism is disposed on the other of the two opposite surfaces of the bottom wall; and a force bearing member, installed on the ring-shaped frame.

19. The head-mounted device according to claim 18, wherein the force bearing member is connected with the host housing and located on one side of the ring-shaped frame; wherein the force bearing member comprises:

a support plate;

a mounting plate, arranged with an obtuse angle relative to the support plate and mounted on the host housing;

a neck portion, disposed between and connected to the support plate and the mounting plate; and a soft pad, arranged on the support plate.

20. The head-mounted device according to claim 18, wherein the force bearing member is connected with the second housing and located on one side of the ring-shaped frame; the force bearing member comprises a fixing plate and a soft pad wrapping the mounting plate; the fixing plate is fixed on the second housing.

* * * * *